(12) United States Patent
Seo et al.

(10) Patent No.: US 9,496,257 B2
(45) Date of Patent: Nov. 15, 2016

(54) REMOVAL OF SEMICONDUCTOR GROWTH DEFECTS

(71) Applicants:International Business Machines Corporation, Armonk, NY (US); GLOBALFOUNDRIES Inc., Grand Cayman (KY)

(72) Inventors: Soon-cheon Seo, Glenmont, NY (US); Linus Jang, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 14/318,822

(22) Filed: Jun. 30, 2014

(65) Prior Publication Data

US 2015/0380405 A1    Dec. 31, 2015

(51) Int. Cl.
| | |
|---|---|
| *H01L 27/088* | (2006.01) |
| *H01L 29/423* | (2006.01) |
| *H01L 21/311* | (2006.01) |
| *H01L 21/3105* | (2006.01) |
| *H01L 21/306* | (2006.01) |
| *H01L 21/027* | (2006.01) |
| *H01L 29/78* | (2006.01) |
| *H01L 21/8234* | (2006.01) |
| *H01L 21/84* | (2006.01) |

(52) U.S. Cl.
CPC ....... *H01L 27/0886* (2013.01); *H01L 21/0274* (2013.01); *H01L 21/30604* (2013.01); *H01L 21/31053* (2013.01); *H01L 21/31111* (2013.01); *H01L 21/31133* (2013.01); *H01L 21/31144* (2013.01); *H01L 29/4238* (2013.01); *H01L 29/785* (2013.01); *H01L 21/823412* (2013.01); *H01L 21/823431* (2013.01); *H01L 21/823437* (2013.01); *H01L 21/84* (2013.01)

(58) Field of Classification Search
CPC .................... H01L 29/66795; H01L 21/3086; H01L 29/41791; H01L 29/785
USPC .......................................... 257/288; 438/595
See application file for complete search history.

(56) References Cited

U.S. PATENT DOCUMENTS

| | | |
|---|---|---|
| 6,749,969 B2 | 6/2004 | Horak et al. |
| 6,813,376 B1 | 11/2004 | Hennessey et al. |
| 7,001,713 B2 | 2/2006 | Chen et al. |
| 7,271,428 B2 | 9/2007 | Fan et al. |

(Continued)

*Primary Examiner* — David Vu
*Assistant Examiner* — Jonathan Han
(74) *Attorney, Agent, or Firm* — Scully, Scott, Murphy & Presser, P.C.; Steven J. Meyers

(57) ABSTRACT

After semiconductor material portions and gate structures are formed on a substrate, a dielectric material layer is deposited on the semiconductor material portions and the gate structures. An anisotropic etch is performed on the dielectric material layer to form gate spacers, while a mask layer protects peripheral portions of the semiconductor material portions and the gate structures to avoid unwanted physical exposure of semiconductor surfaces. A selective epitaxy can be performed to form raised active regions on the semiconductor material portions. Formation of semiconductor growth defects during the selective epitaxy is prevented by the dielectric material layer. Alternately, a selective semiconductor deposition process can be performed after formation of dielectric gate spacers on gate structures overlying semiconductor material portions. Semiconductor growth defects can be removed by an etch while a mask layer protects raised active regions on the semiconductor material portions.

8 Claims, 19 Drawing Sheets

(56) References Cited

U.S. PATENT DOCUMENTS

| | | |
|---|---|---|
| 7,357,876 B2 | 4/2008 | Sreenivasan |
| 7,781,315 B2 | 8/2010 | Lenoble |
| 7,883,988 B2 | 2/2011 | Tanaka |
| 8,168,517 B2 | 5/2012 | Oh |
| 8,558,278 B2 | 10/2013 | Chuang et al. |
| 2013/0105916 A1* | 5/2013 | Chang ............... H01L 21/31116 257/410 |
| 2013/0334614 A1 | 12/2013 | Liaw |
| 2014/0099792 A1* | 4/2014 | Bergendahl ......... H01L 21/3086 438/696 |

* cited by examiner

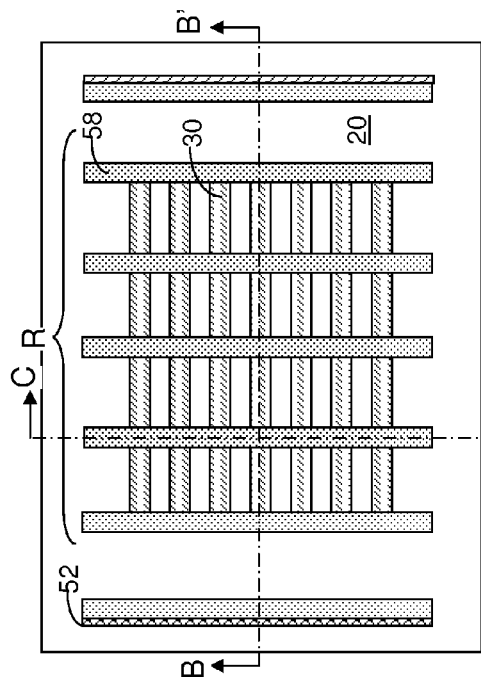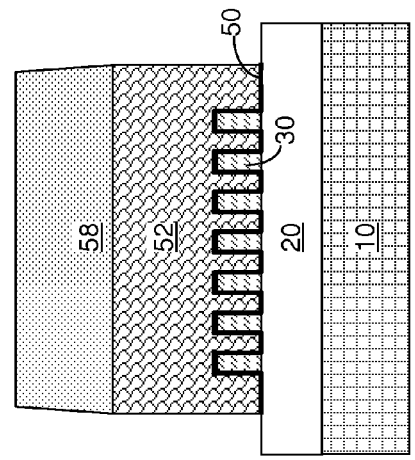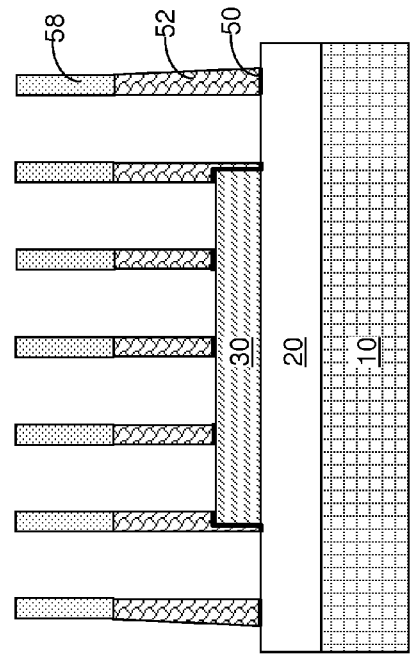
FIG. 3A
FIG. 3B
FIG. 3C

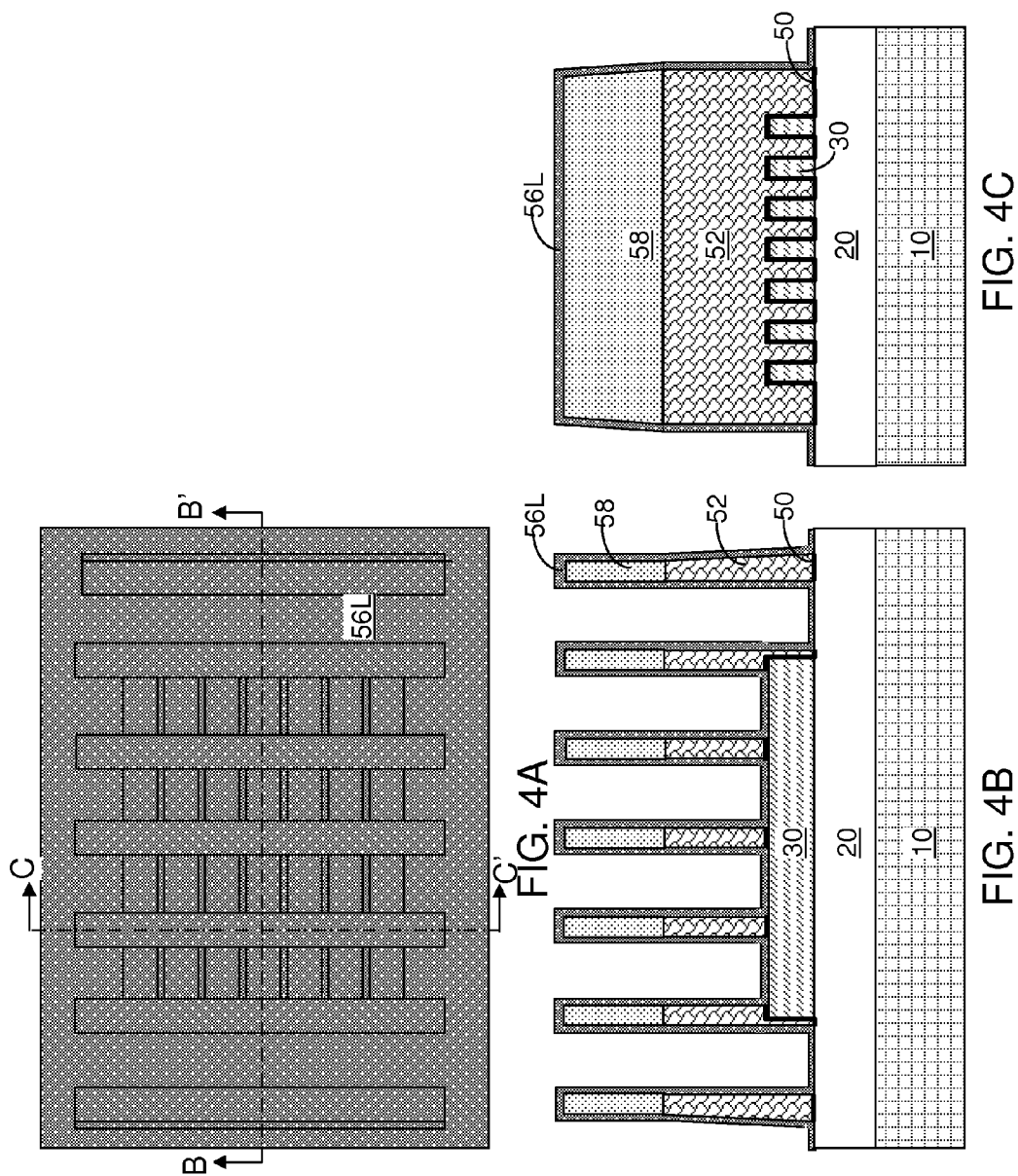

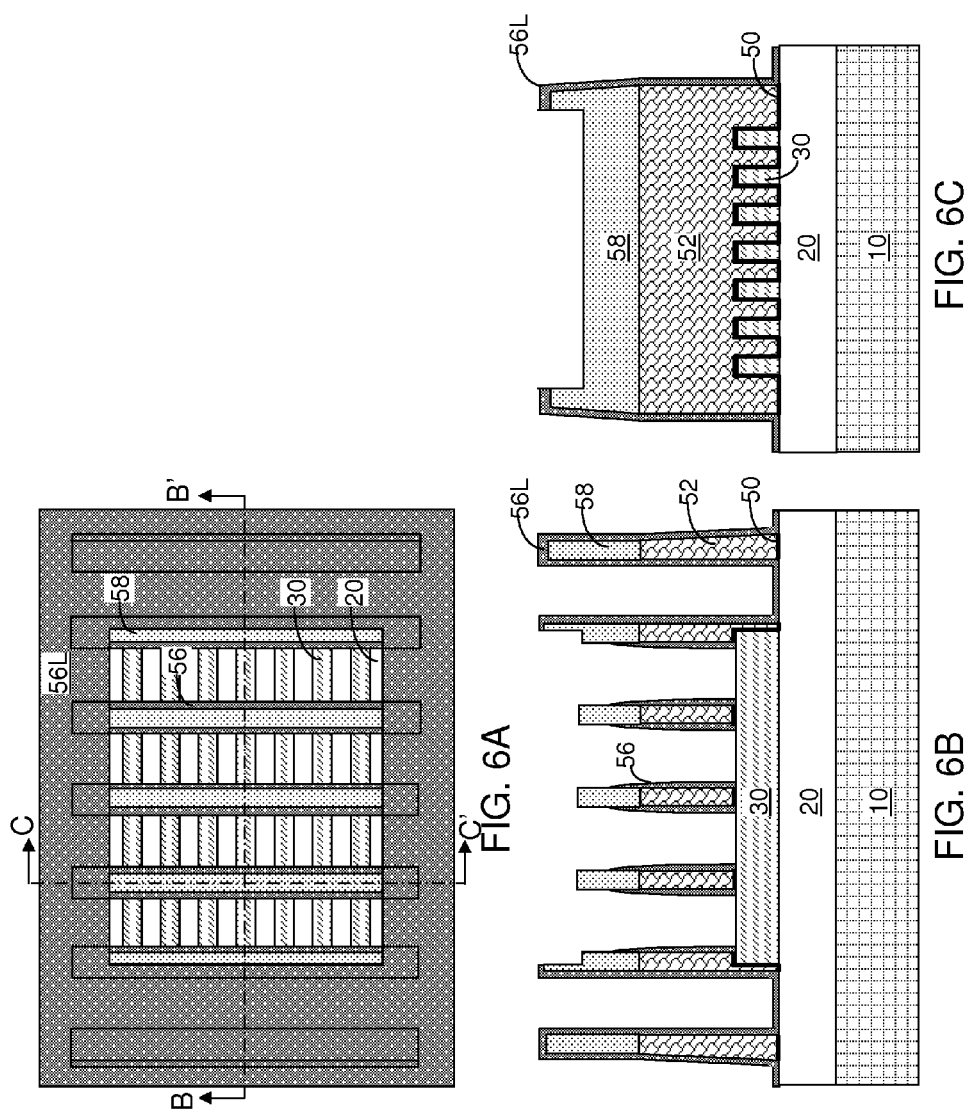

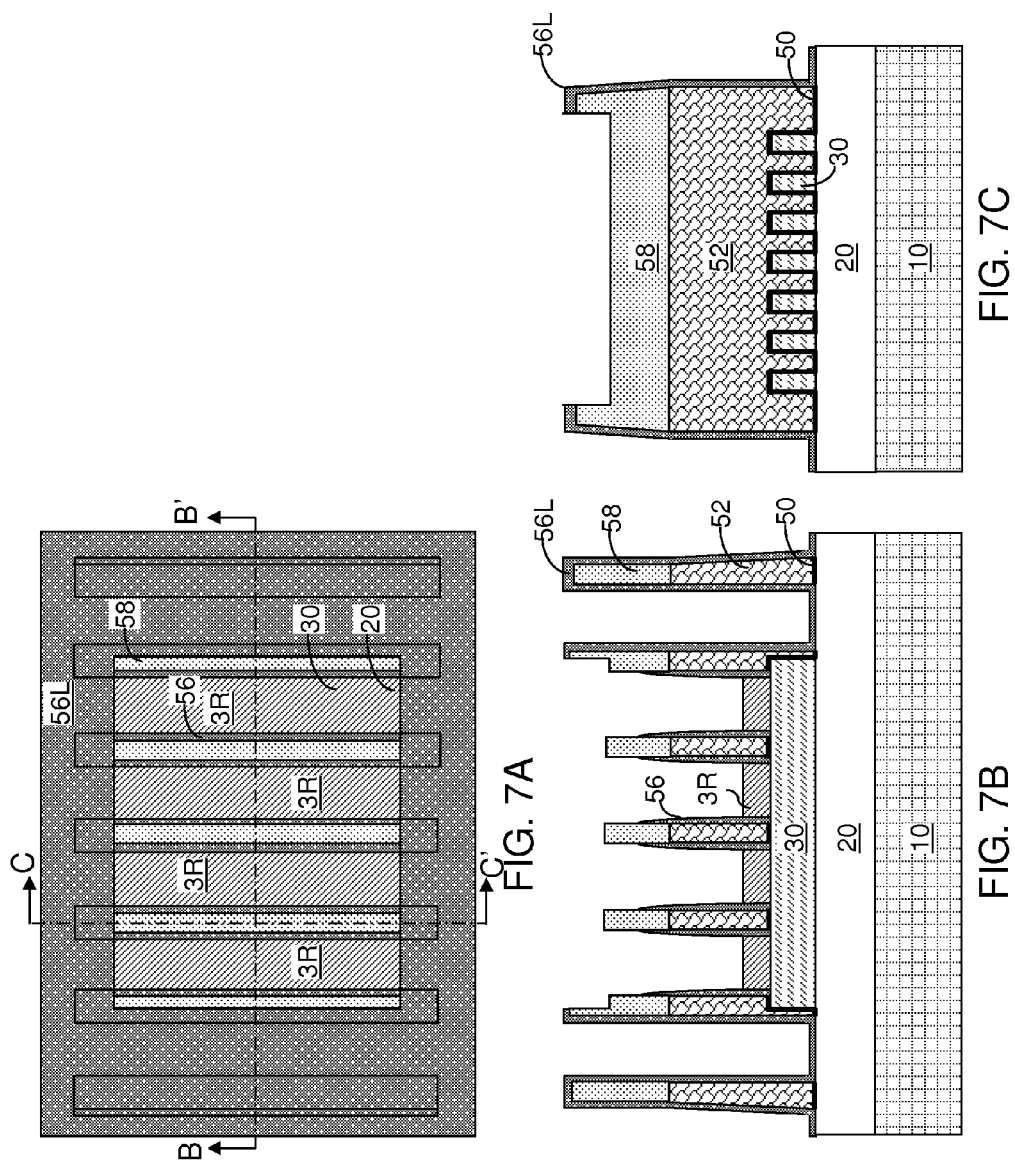

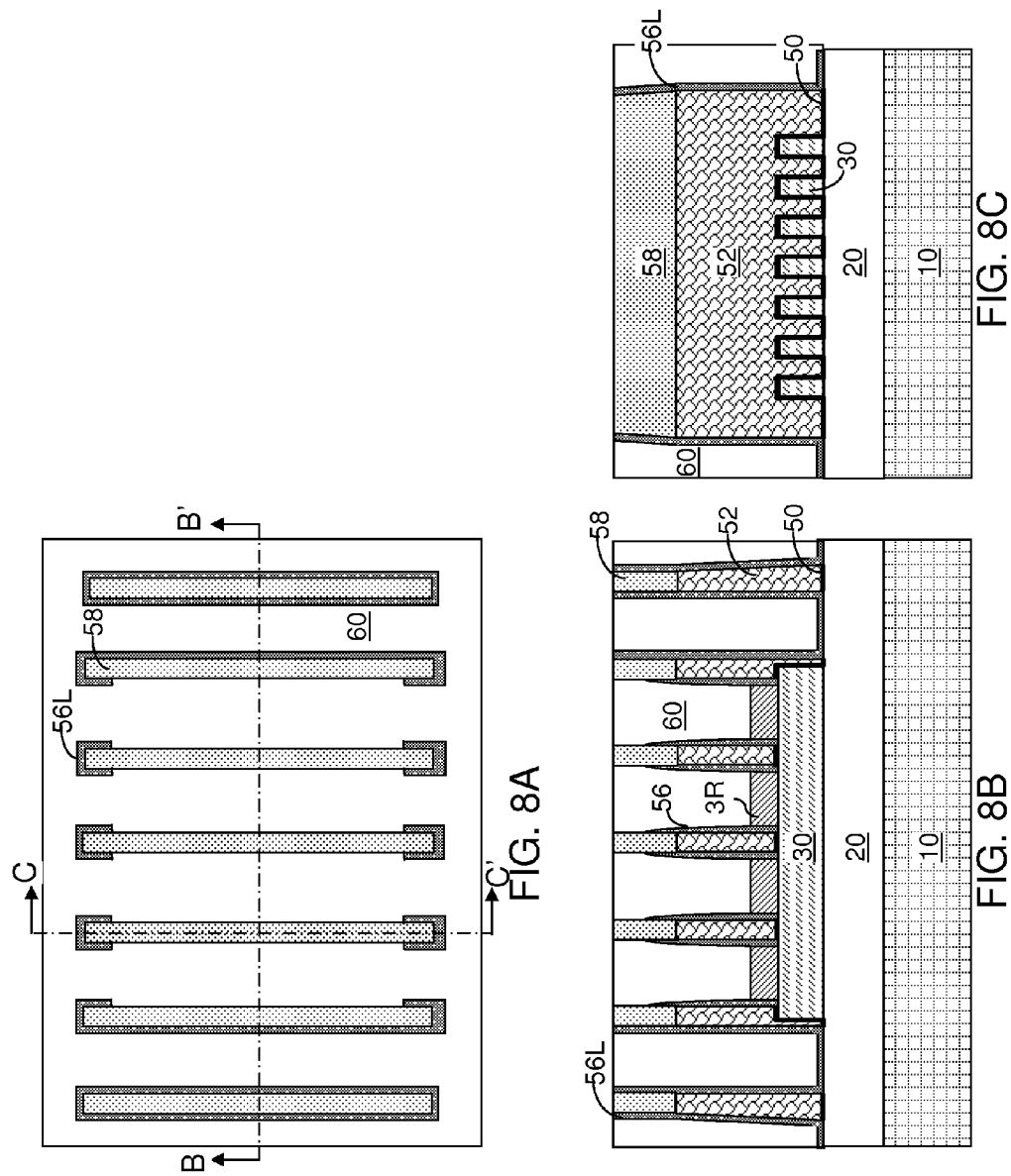

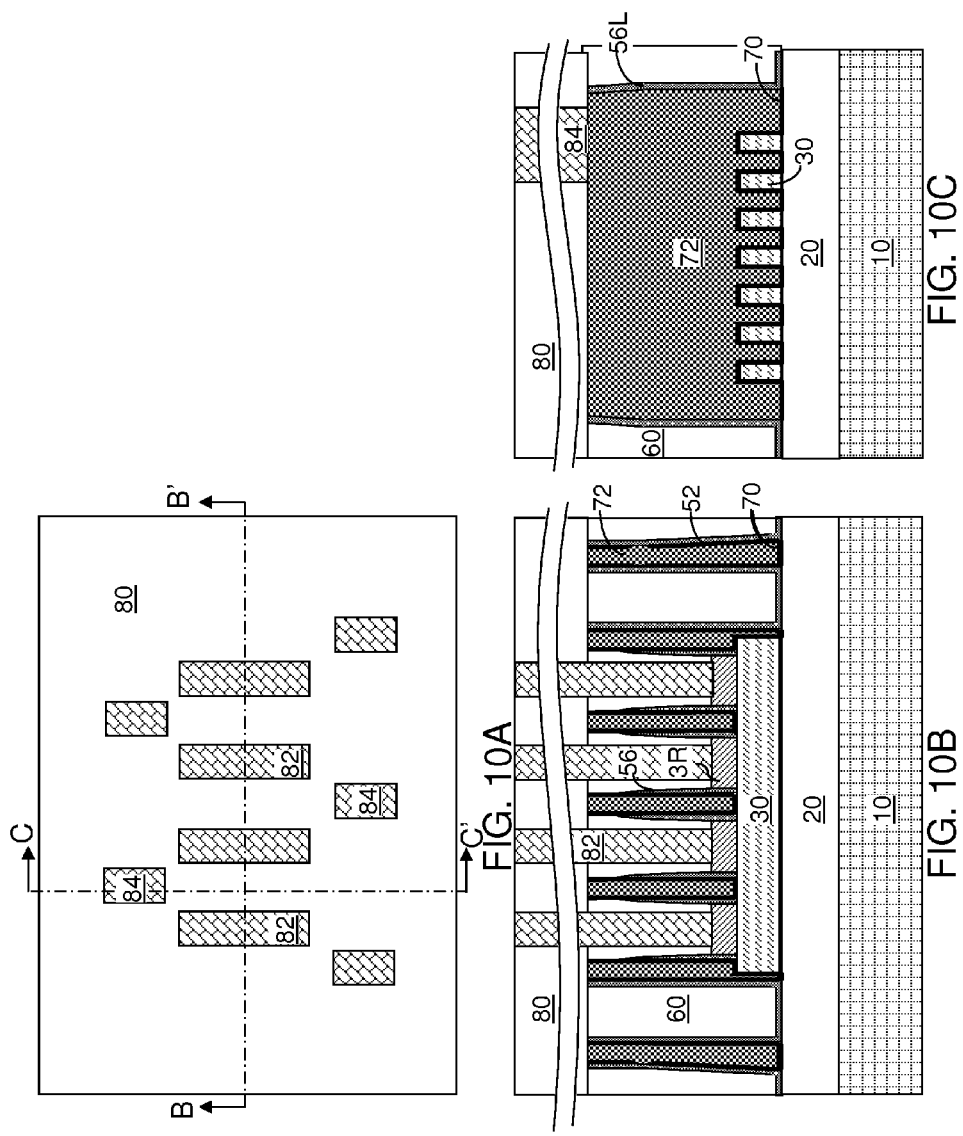

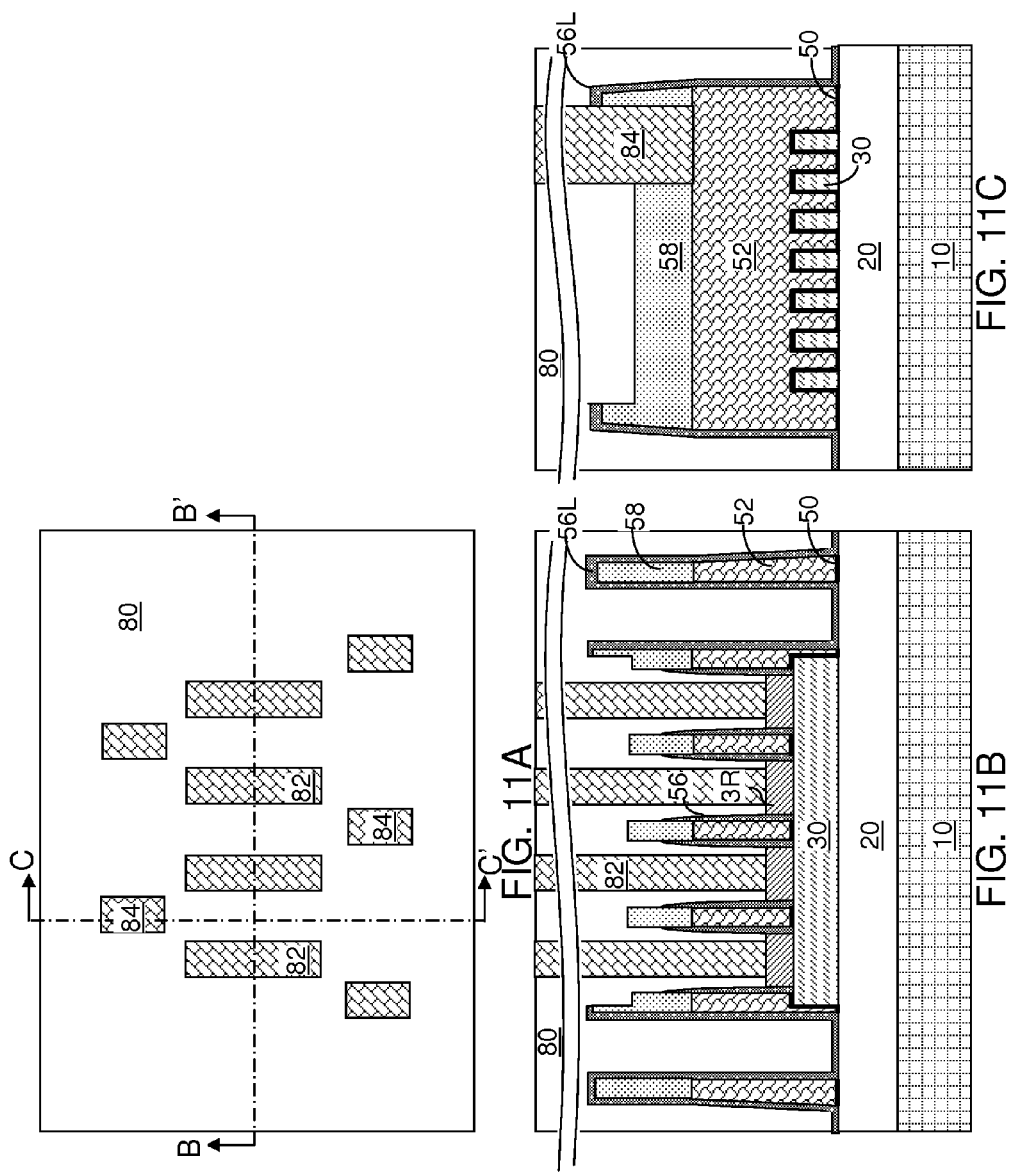

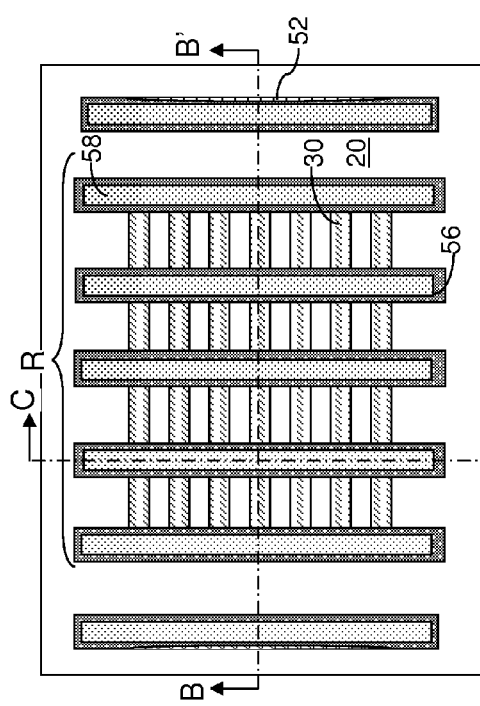
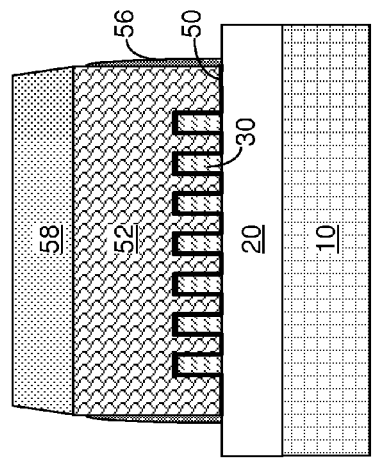
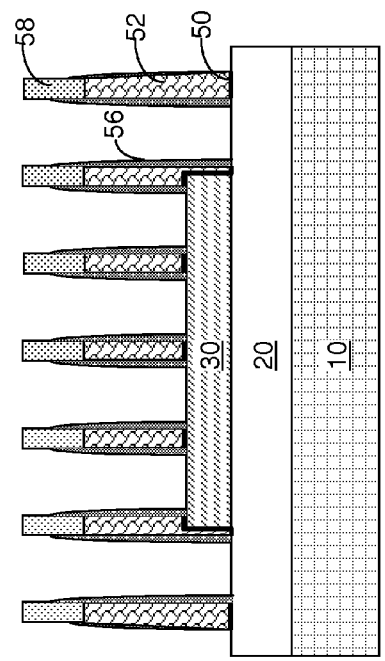
FIG. 12A
FIG. 12B
FIG. 12C

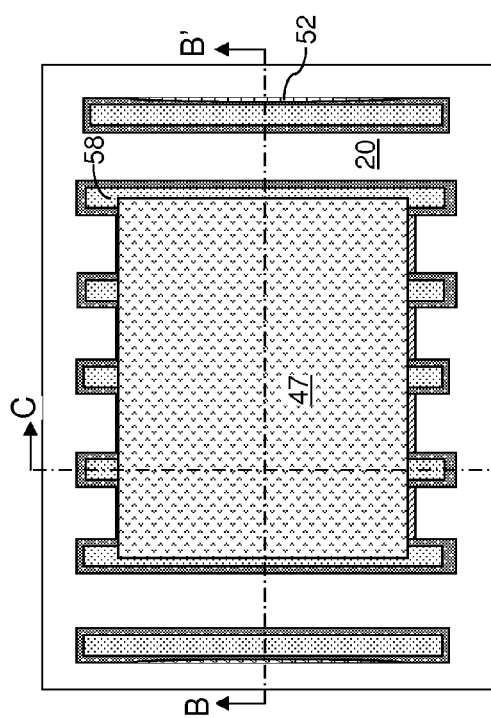
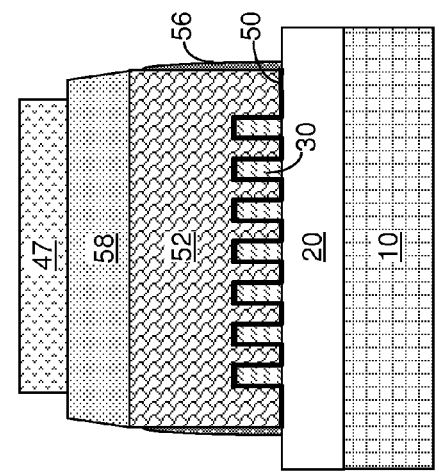
FIG. 15C
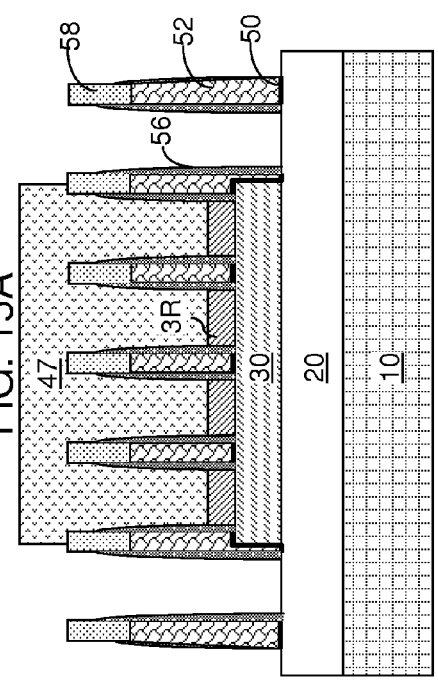
FIG. 15B

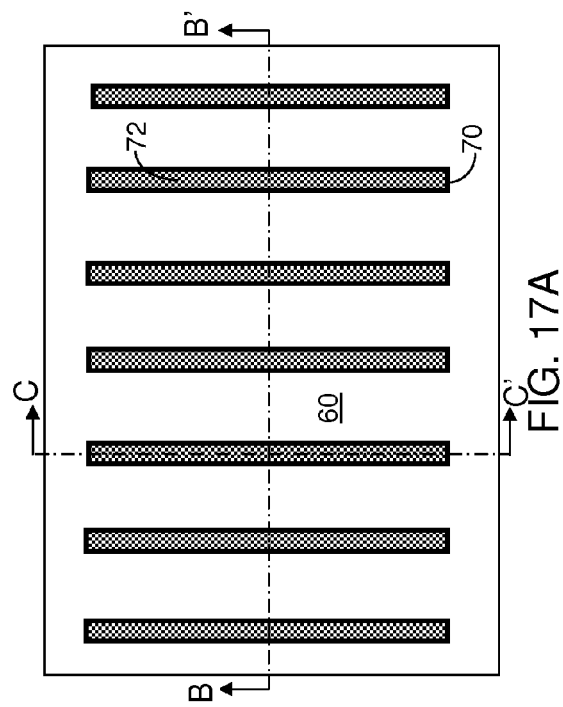
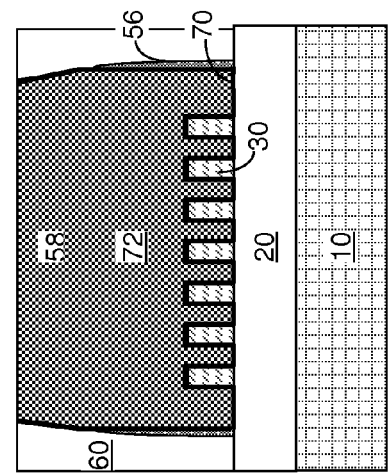
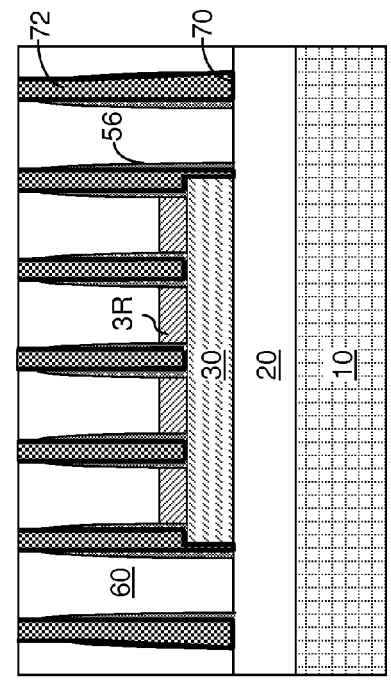
FIG. 17A
FIG. 17B
FIG. 17C

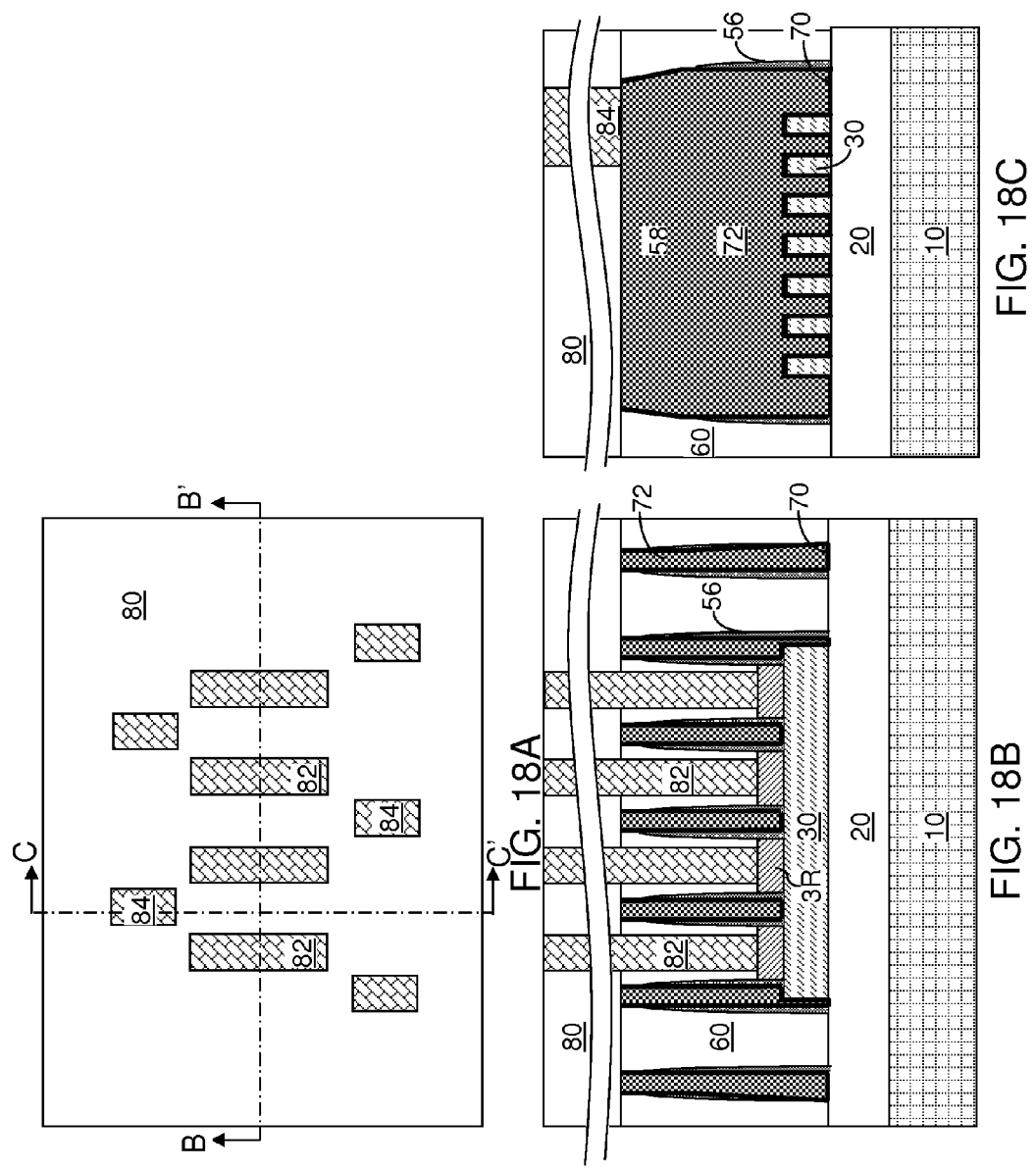

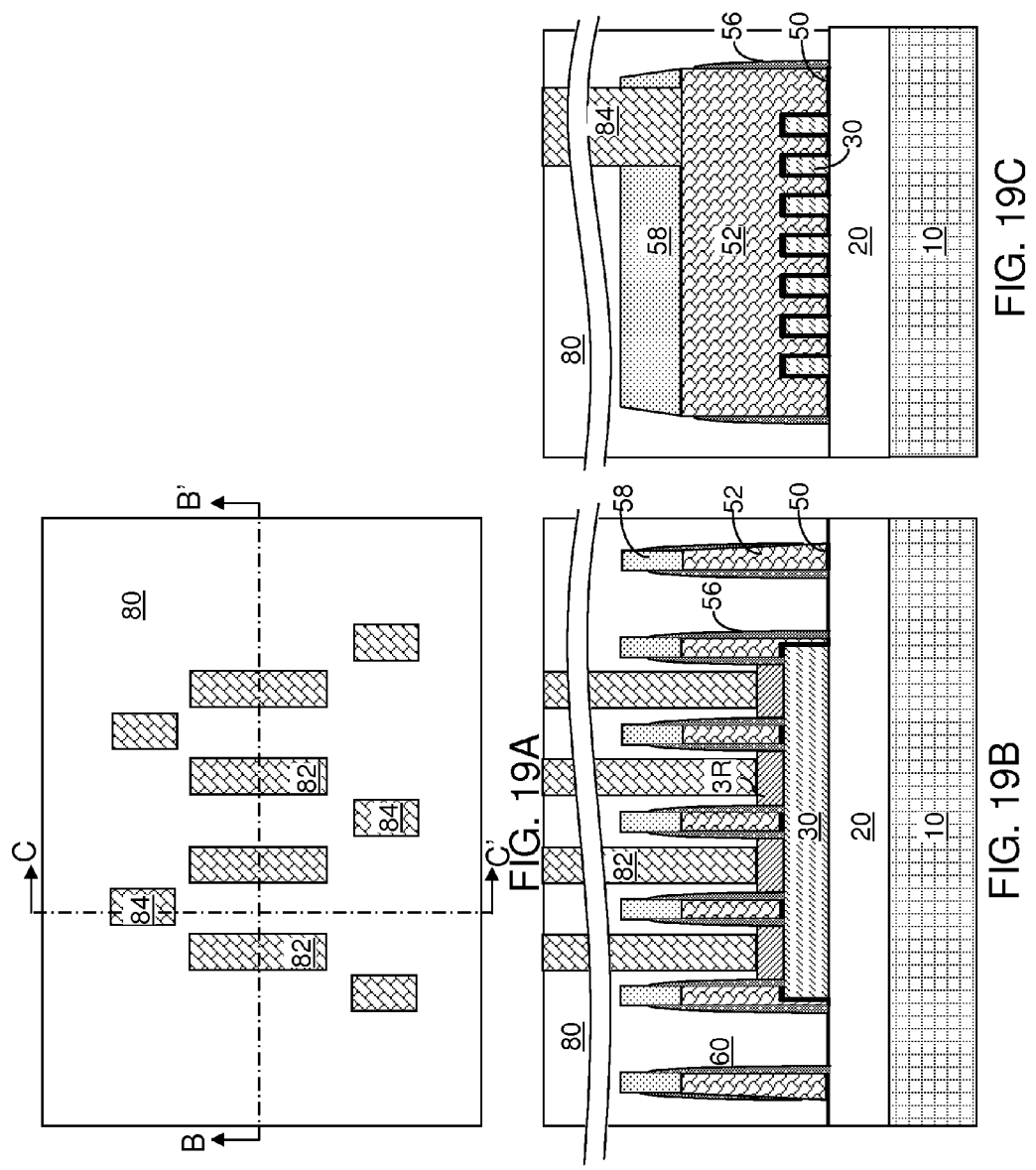

REMOVAL OF SEMICONDUCTOR GROWTH DEFECTS

BACKGROUND

The present disclosure relates to a semiconductor structure, and particularly to a semiconductor structure from which semiconductor growth defects are avoided, and a method of manufacturing the same.

Selective epitaxial deposition of semiconductor materials can be employed to add semiconductor materials only on pre-existing semiconductor surfaces while avoiding deposition of the semiconductor materials on dielectric surfaces. Selective epitaxial deposition processes can be advantageously employed, for example, to form raised source regions and raised drain regions on field effect transistors.

Deposition of a semiconductor occurs on all physically exposed semiconductor surfaces during a selective semiconductor deposition process. Accidental physical exposure of a semiconductor surface that should be protected with an overlying dielectric material during a selective epitaxial deposition process induces unwanted deposition of the semiconductor material on the accidentally exposed semiconductor surface. Such accidental physical exposure of a semiconductor surface may occur due to run-to-run process variations, within-wafer non-uniformity of an etch process, and/or due to loading effect of an etch process that tends to remove more material in isolated structures or peripheral structures than in an array environment.

Such unwanted deposition of the semiconductor material induces formation of semiconductor material portions that are grown on an underlying semiconductor surface, which are herein referred to as semiconductor growth defects. In cases where prevention of semiconductor growth defects is not practicable, methods for removing such semiconductor growth defects are desired.

SUMMARY

After semiconductor material portions and gate structures are formed on a substrate, a dielectric material layer is deposited on the semiconductor material portions and the gate structures. An anisotropic etch is performed on the dielectric material layer to form gate spacers, while a mask layer protects peripheral portions of the semiconductor material portions and the gate structures to avoid unwanted physical exposure of semiconductor surfaces. A selective epitaxy can be performed to form raised active regions on the semiconductor material portions. Formation of semiconductor growth defects during the selective epitaxy is prevented by the dielectric material layer. Alternately, a selective semiconductor deposition process can be performed after formation of dielectric gate spacers on gate structures overlying semiconductor material portions. Semiconductor growth defects can be removed by an etch while a mask layer protects raised active regions on the semiconductor material portions.

According to an aspect of the present disclosure, a semiconductor structure includes at least one semiconductor material portion located on a substrate, and a gate structure straddling the at least one semiconductor material portion. The gate structure includes a pair of lengthwise sidewalls adjoined to each other through a pair of endwalls. The semiconductor structure further includes a contiguous dielectric material liner contacting a top surface of the substrate and the pair of endwalls, and a dielectric spacer contiguously adjoined to, and having a same composition as, the contiguous dielectric material liner, and contacting a lower portion of one of the pair of lengthwise sidewalls. A topmost edge of the dielectric spacer is located below a horizontal plane including a topmost surface of the gate structure.

According to another aspect of the present disclosure, a method of forming a semiconductor structure is provided. At least one semiconductor material portion is formed on a substrate. A gate structure is formed across the at least one semiconductor material portion. The gate structure includes a pair of lengthwise sidewalls adjoined to each other through a pair of endwalls. A contiguous dielectric material liner is formed on a top surface the substrate, the pair of lengthwise sidewalls, the pair of endwalls, and a top surface of the gate structure. A patterned photoresist layer is formed over the contiguous dielectric material layer. A sidewall of the patterned photoresist layer overlies the top surface of the gate structure. At least one dielectric spacer is formed by anisotropically etching portions of the contiguous dielectric material layer within an opening in the patterned photoresist layer. Each of the at least one dielectric spacer is contiguously adjoined to a remaining portion of the contiguous dielectric material liner that underlies the patterned photoresist layer. A selective semiconductor deposition process is performed on the at least one semiconductor material portion while the remaining portion of the contiguous dielectric material layer is present over the substrate.

According to yet another aspect of the present disclosure, another method of forming a semiconductor structure is provided. At least one semiconductor material portion is formed on a substrate. A gate structure is formed across the at least one semiconductor material portion. The gate structure includes a pair of lengthwise sidewalls adjoined to each other through a pair of endwalls. A dielectric spacer is formed by depositing, and anisotropically etching, a contiguous dielectric material layer around the gate structure. At least one raised semiconductor material portion is formed on the at least one semiconductor material portion employing a selective semiconductor deposition process. A patterned photoresist layer is formed over the at least one raised semiconductor material portion. The patterned photoresist layer does not overlie the pair of endwalls. An etch process is performed employing an etch chemistry that removes a semiconductor material while the patterned photoresist layer is present over the at least one raised semiconductor material portion.

BRIEF DESCRIPTION OF SEVERAL VIEWS OF THE DRAWINGS

FIG. 3A is a top-down view of the first exemplary semiconductor structure after formation of gate structures according to the first embodiment of the present disclosure.

FIG. 3B is a vertical cross-sectional view of the first exemplary semiconductor structure along the vertical plane B-B' of FIG. 3A.

FIG. 3C is a vertical cross-sectional view of the first exemplary semiconductor structure along the vertical plane C-C' of FIG. 3A.

FIG. 4A is a top-down view of the first exemplary semiconductor structure after formation of a contiguous dielectric material liner according to the first embodiment of the present disclosure.

FIG. 4B is a vertical cross-sectional view of the first exemplary semiconductor structure along the vertical plane B-B' of FIG. 4A.

FIG. 4C is a vertical cross-sectional view of the first exemplary semiconductor structure along the vertical plane C-C' of FIG. 4A.

FIG. 6A is a top-down view of the first exemplary semiconductor structure after removal of the dielectric spacers according to the first embodiment of the present disclosure.

FIG. 6B is a vertical cross-sectional view of the first exemplary semiconductor structure along the vertical plane B-B' of FIG. 6A.

FIG. 6C is a vertical cross-sectional view of the first exemplary semiconductor structure along the vertical plane C-C' of FIG. 6A.

FIG. 7A is a top-down view of the first exemplary semiconductor structure after formation of raised semiconductor material portions employing a selective semiconductor deposition process according to the first embodiment of the present disclosure.

FIG. 7B is a vertical cross-sectional view of the first exemplary semiconductor structure along the vertical plane B-B' of FIG. 7A.

FIG. 7C is a vertical cross-sectional view of the first exemplary semiconductor structure along the vertical plane C-C' of FIG. 7A.

FIG. 8A is a top-down view of the first exemplary semiconductor structure after deposition and planarization of a planarization dielectric layer according to the first embodiment of the present disclosure.

FIG. 8B is a vertical cross-sectional view of the first exemplary semiconductor structure along the vertical plane B-B' of FIG. 8A.

FIG. 8C is a vertical cross-sectional view of the first exemplary semiconductor structure along the vertical plane C-C' of FIG. 8A.

FIG. 10A is a top-down view of the first exemplary semiconductor structure after formation of contact via structures according to the first embodiment of the present disclosure.

FIG. 10B is a vertical cross-sectional view of the first exemplary semiconductor structure along the vertical plane B-B' of FIG. 10A.

FIG. 10C is a vertical cross-sectional view of the first exemplary semiconductor structure along the vertical plane C-C' of FIG. 10A.

FIG. 11A is a top-down view of a variation of the first exemplary semiconductor structure according to the first embodiment of the present disclosure.

FIG. 11B is a vertical cross-sectional view of the first exemplary semiconductor structure along the vertical plane B-B' of FIG. 11A.

FIG. 11C is a vertical cross-sectional view of the first exemplary semiconductor structure along the vertical plane C-C' of FIG. 11A.

FIG. 12A is a top-down view of a second exemplary semiconductor structure after formation of dielectric spacers according to a second embodiment of the present disclosure.

FIG. 12B is a vertical cross-sectional view of the second exemplary semiconductor structure along the vertical plane B-B' of FIG. 12A.

FIG. 12C is a vertical cross-sectional view of the second exemplary semiconductor structure along the vertical plane C-C' of FIG. 12A.

FIG. 15A is a top-down view of the second exemplary semiconductor after an etch process that removes semiconductor deposition portions according to the second embodiment of the present disclosure.

FIG. 15B is a vertical cross-sectional view of the second exemplary semiconductor structure along the vertical plane B-B' of FIG. 15A.

FIG. 15C is a vertical cross-sectional view of the second exemplary semiconductor structure along the vertical plane C-C' of FIG. 15A.

FIG. 17A is a top-down view of the second exemplary semiconductor after formation of replacement gate structures according to the second embodiment of the present disclosure.

FIG. 17B is a vertical cross-sectional view of the second exemplary semiconductor structure along the vertical plane B-B' of FIG. 17A.

FIG. 17C is a vertical cross-sectional view of the second exemplary semiconductor structure along the vertical plane C-C' of FIG. 17A.

FIG. 18A is a top-down view of the second exemplary semiconductor after formation of contact via structures according to the second embodiment of the present disclosure.

FIG. 18B is a vertical cross-sectional view of the second exemplary semiconductor structure along the vertical plane B-B' of FIG. 18A.

FIG. 18C is a vertical cross-sectional view of the second exemplary semiconductor structure along the vertical plane C-C' of FIG. 18A.

FIG. 19A is a top-down view of a variation of the second exemplary semiconductor according to the second embodiment of the present disclosure.

FIG. 19B is a vertical cross-sectional view of the variation of the second exemplary semiconductor structure along the vertical plane B-B' of FIG. 19A.

FIG. 19C is a vertical cross-sectional view of the variation of the second exemplary semiconductor structure along the vertical plane C-C' of FIG. 19A.

DETAILED DESCRIPTION

Figure 1A:
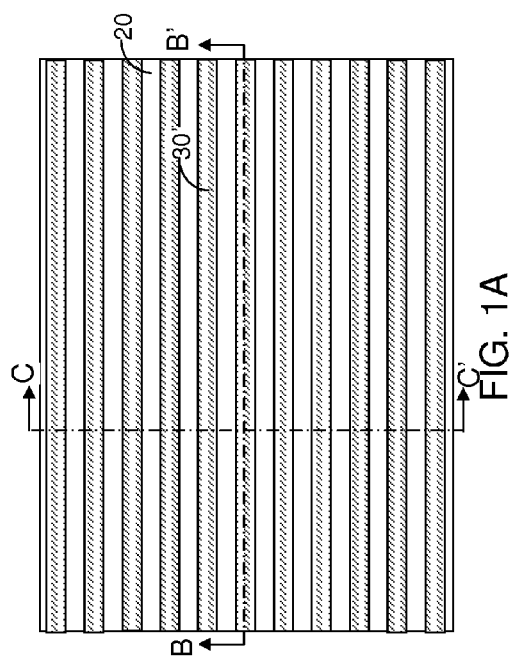
FIG. 1A is a top-down view of a first exemplary semiconductor structure after formation of semiconductor material structures on a substrate according to a first embodiment of the present disclosure.

As stated above, the present disclosure relates to a semiconductor structure from which semiconductor growth defects are avoided, and a method of manufacturing the same. These aspects of the present disclosure are now described in detail with accompanying figures. It is noted that like reference numerals refer to like elements across different embodiments. The drawings are not necessarily drawn to scale. As used herein, ordinals such as "first," "second," and "third" are employed merely to distinguish similar elements, and different ordinals may be employed to designate a same element in the specification and/or claims.

Figure 1B:
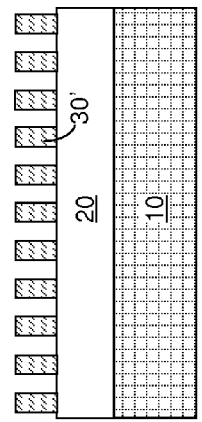
FIG. 1B is a vertical cross-sectional view of the first exemplary semiconductor structure along the vertical plane B-B' of FIG. 1A.
Figure 1C:
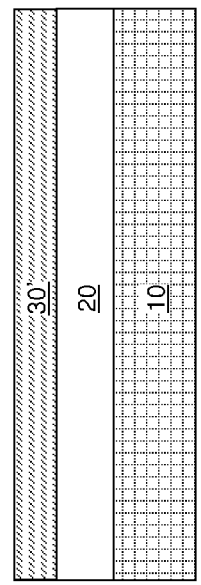
FIG. 1C is a vertical cross-sectional view of the first exemplary semiconductor structure along the vertical plane C-C' of FIG. 1A.

Referring to FIGS. 1A-1C, a first exemplary semiconductor structure according to a first embodiment of the present disclosure includes a substrate (10, 20) and semiconductor material structures 30' formed on the top surface of the substrate (10, 20). The semiconductor material structures 30' can be patterned from a semiconductor material layer that is provided on, or in, a substrate. For example, a semiconductor-on-insulator (SOI) substrate including a stack, from bottom to top, of a handle substrate 10, a buried insulator layer 20, and a top semiconductor layer can be provided, and the top semiconductor layer can be patterned to form the semiconductor material structures 30'. Alternately, a bulk semiconductor substrate can be provided, and a top portion of the bulk semiconductor substrate can be patterned to form the semiconductor material structures 30'. In this case, the unpatterned portion of the bulk semiconductor substrate is the substrate that substitutes the stack of a handle substrate 10 and a buried insulator layer 20 in the case of an SOI substrate.

The semiconductor material of the semiconductor material structures 30' can be selected from elemental semiconductor materials (e.g., silicon, germanium, carbon, or alloys thereof), III-V semiconductor materials, or II-VI semiconductor materials. In one embodiment, the semiconductor material structures 30' can include a single crystalline semiconductor material such as single crystalline silicon.

In one embodiment, the semiconductor material structures 30' can be a plurality of semiconductor fins. As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a channel region is located within a semiconductor fin. As used herein, a "planar field effect transistor" refers to a field effect transistor in which the channel region consists of one or more surface regions underlying one or more horizontal semiconductor surfaces. In one embodiment, planar semiconductor material portions to be employed as active regions of at least one planar field effect transistor can be formed in lieu of, or in addition to, the plurality of semiconductor fins.

Figure 2A:
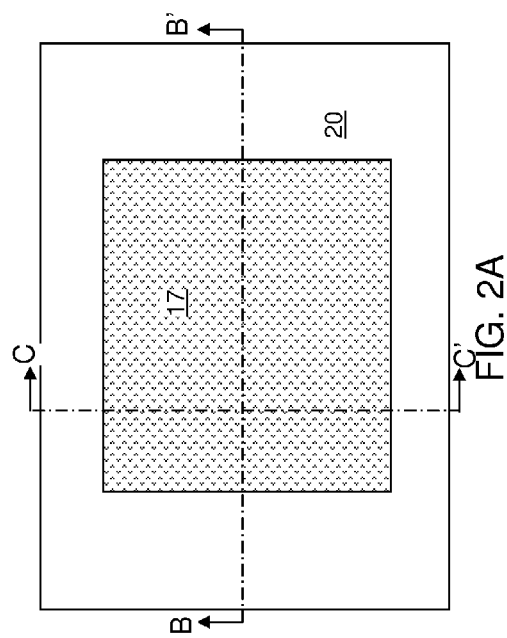
FIG. 2A is a top-down view of the first exemplary semiconductor structure after patterning of semiconductor material portions according to the first embodiment of the present disclosure.
Figure 2C:
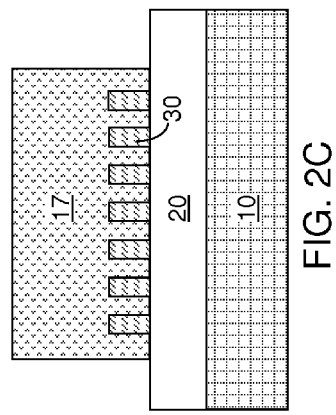
FIG. 2C is a vertical cross-sectional view of the first exemplary semiconductor structure along the vertical plane C-C' of FIG. 2A.
Figure 2B:
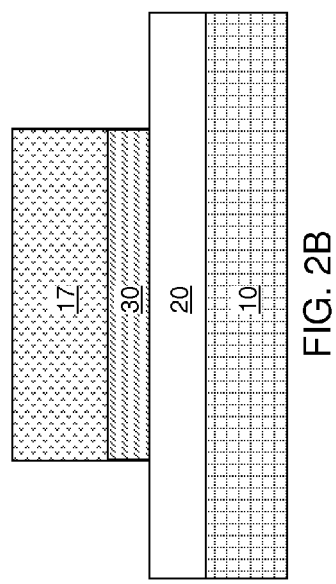
FIG. 2B is a vertical cross-sectional view of the first exemplary semiconductor structure along the vertical plane B-B' of FIG. 2A.

Referring to FIGS. 2A-2C, the semiconductor material structures 30' can be patterned employing a lithographic mask. The lithographic mask includes a pattern including a shape of a region of the semiconductor material structures 30'. A first photoresist layer 17 is applied over the semiconductor material structures 30' and the substrate (10, 20). When illustrated in a lithographic tool employing the photolithographic mask, the first photoresist layer 17 is patterned so that, upon development, the patterned first photoresist layer 17 blocks a region of the semiconductor material structures 30', while not blocking the complementary region of the semiconductor material structures 30'. In one embodiment, the patterned first photoresist layer 17 can cover portions of a plurality of semiconductor material structures 30' such that multiple lengthwise sidewalls of the plurality of semiconductor material structures 30' are covered by the patterned first photoresist layer.

An etch process can be performed to remove portions of the semiconductor material structures 30' that are not covered by the patterned first photoresist layer 17. In one embodiment, the etch process can be an anisotropic etch process. In one embodiment, a portion of the patterned first photoresist layer 17 can have a rectangular shape, and the remaining portions of the semiconductor material structures 30' can include sidewalls that vertically coincide with sidewalls of the patterned first photoresist layer 17. As used herein, two surfaces are "vertically coincident" if there exists a vertical plane that contains the two surfaces.

The remaining portions of the semiconductor material structures 30' after the etch are herein referred to semiconductor material portions 30. In one embodiment, the semiconductor material portions 30 can be semiconductor fins. The patterned first photoresist layer 17 can be subsequently removed, for example, by ashing.

In one embodiment, each of the semiconductor material portions 30 can be a semiconductor fin that is laterally bound by a pair of lengthwise sidewalls and a pair of widthwise sidewalls. As used herein, a "lengthwise direction" of an element refers to the direction of the axis which passes through the center of mass of the element and about which the moment of inertia of the element becomes a minimum. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, the semiconductor material portions can include at least one semiconductor fin having a rectangular horizontal cross-sectional shape. In one embodiment, a plurality of semiconductor fins can be within a one-dimensional array having a pitch along the widthwise direction of the semiconductor fins.

Referring to FIGS. 3A-3C, a stack of gate level layers can be deposited and lithographically patterned to form gate structures (50, 52, 58). In one embodiment, the gate structures (50, 52, 58) can be disposable structures that are removed subsequently, for example, after formation of a planarization dielectric layer and are replaced with permanent gate structures (which are referred to as replacement gate structures). In another embodiment, the gate structures (50, 52, 58) can be permanent structures that constitute stacks of a gate dielectric and a gate electrode.

The gate level layers can include, for example, an optional gate dielectric layer, a gate semiconductor layer, and a dielectric cap layer. The optional gate dielectric layer, if present, can include a dielectric semiconductor-containing compound (e.g., silicon oxide, silicon nitride, and/or silicon oxynitride) and/or a dielectric metal compound (e.g., dielectric metal oxide, dielectric metal nitride, and/or dielectric metal oxynitride). In one embodiment, the gate dielectric layer can be any dielectric material that can be employed as a gate dielectric of a field effect transistor as known in the art. The gate semiconductor layer includes a semiconductor material, which may be doped or undoped. Optionally, the gate conductor layer can include a work function metal layer that tunes the threshold voltage of access transistor to be formed. The dielectric cap layer includes a dielectric material such as silicon nitride, silicon oxide, and/or a dielectric metal oxide. In one embodiment, the thickness of the dielectric cap layer can be greater than the height of the semiconductor material portions 30.

The gate level layers can be patterned by a combination of lithography and etch to form various gate structures (50, 52, 58). Each remaining portion of the gate dielectric layer constitutes a gate dielectric 50. Each remaining portion of the gate semiconductor layer constitutes a gate semiconductor portion 52. Each remaining portion of the dielectric cap layer constitutes a dielectric gate cap 58.

In one embodiment, the gate structures (50, 52, 58) can be parallel among one another, i.e., have lengthwise directions that are parallel among one another. A subset of the gate structures (50, 52, 58) can be formed across the semiconductor material portions 30 as an array R, which may be a periodic array. Additional gate structures (50, 52, 58) can be formed outside of the array R and in proximity to the array R of the gate structures (50, 52, 58) that straddle the semiconductor material portions 30 such that at least one of the additional gate structures (50, 52, 58) does not straddle the semiconductor material portions 30. In this case, the additional gate structures (50, 52, 58) can help improve the uniformity of the vertical profiles of the gate structures (50, 52, 58) within the array R by providing uniform local environment (such as etch pattern factor) for the gate structures (50, 52, 58) within the array R. However, the additional gate structures (50, 52, 58) that are located outside of the array R may not have further additional gate structures along the direction away from the array R. In this case, the outermost gate structures (50, 52, 58) located outside of the array R can develop a vertical profile including tapered sidewalls, i.e., sidewalls having a significant angle with respect to a vertical line such that a subsequent spacer formation process may be affected.

Due to the corner erosion that occurs at end portions of each dielectric gate cap 58 during patterning of the gate structures (50, 52, 58), endwalls of each dielectric gate cap 58 can develop a tapered vertical profile. In other words, the vertical profile of each dielectric gate cap 58 within a vertical plane extending along the lengthwise direction of the corresponding gate structure (50, 52, 58) can be trapezoidal as illustrated in FIG. 3C.

Each gate structure (50, 52, 58) includes a pair of lengthwise sidewalls adjoined to each other through a pair of endwalls. As used herein, an "endwall" refers to a sidewall that is not along the direction of the lengthwise sidewalls of a semiconductor material portion. The gate structures (50, 52, 58) within the array R can straddle the semiconductor material portions 30. Various source extension regions (not shown) and drain extension regions (not shown) and halo implant regions (not shown) may be formed in the semiconductor material portions 30 employing methods known in the art.

Referring to FIGS. 4A-4C, a contiguous dielectric material liner 56L is formed on the physically exposed surfaces of the gate structures (50, 52, 58), the semiconductor material portions 30, and the substrate (10, 20). Specifically, the contiguous dielectric material liner 56L can be formed on the top surface the substrate (10, 20), and the pair of lengthwise sidewalls, the pair of endwalls, and the top surface of each gate structure (50, 52, 58). The contiguous dielectric material liner 56L includes a dielectric material such as silicon nitride, silicon oxide, and/or a dielectric metal oxide. The contiguous dielectric material liner 56L can be deposited employing a conformal deposition method such as chemical vapor deposition (CVD) or atomic layer deposition (ALD). The thickness of the contiguous dielectric material liner 56L can be in a range from 2 nm to 60 nm, although lesser and greater thicknesses can also be employed.

Figure 5A:
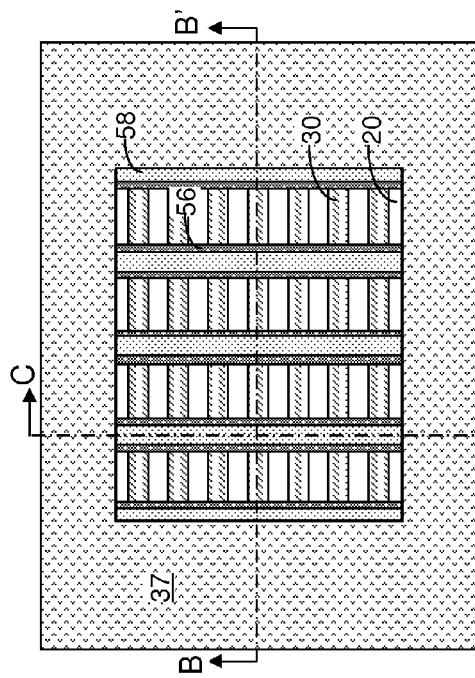
FIG. 5A is a top-down view of the first exemplary semiconductor structure after formation of a patterned photoresist layer and formation of dielectric spacers according to the first embodiment of the present disclosure.
Figure 5C:
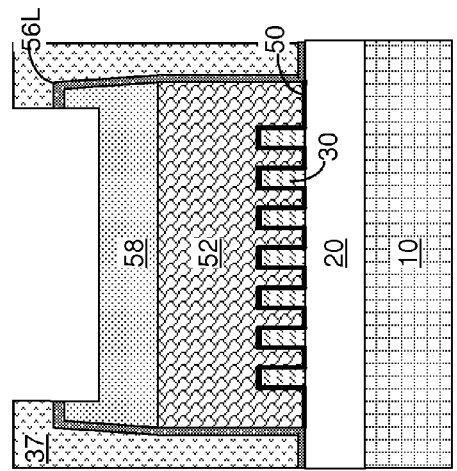
FIG. 5C is a vertical cross-sectional view of the first exemplary semiconductor structure along the vertical plane C-C' of FIG. 5A.
Figure 5B:
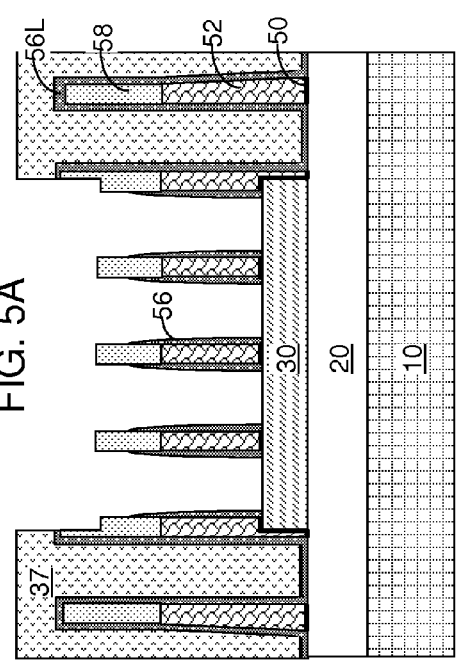
FIG. 5B is a vertical cross-sectional view of the first exemplary semiconductor structure along the vertical plane B-B' of FIG. 5A.

Referring to FIGS. 5A-5C, a patterned second photoresist layer 37 is formed over the contiguous dielectric material liner 56L. The patterned second photoresist layer 37 includes an opening in a region in which deposition of a semiconductor material through a selective semiconductor deposition process is desired, while covering a region in which deposition of the semiconductor material during the selective semiconductor deposition process is not desired.

In one embodiment, the same lithographic mask can be employed to pattern the patterned second photoresist layer 37 as the first photoresist layer 17 (see FIGS. 2A-2C) with inversion of photoresist tones between the two lithographic processes. In one embodiment, the first photoresist layer 17 can include a positive tone photoresist material and the patterned second photoresist layer 37 can include a negative tone photoresist material. In another embodiment, the first photoresist layer 17 can include a negative tone photoresist material, and the patterned second photoresist layer 37 can include a positive tone photoresist material. In this case, the area of the hole in the patterned second photoresist layer 37 can be in substantially the same as the area covered by the patterned first photoresist layer 17. The lateral offset between corresponding sidewalls of the patterned second photoresist layer 37 and the patterned first photoresist layer 17 can be less than the sum of the distance of photoresist edge shifting accompanying the tone inversion, the overlay tolerance of the first lithographic process that defines the location of the sidewalls of the patterned first photoresist layer 17, and the overlay tolerance of the second lithographic process that defines the location of the sidewalls of the patterned second photoresist layer 37. By employing the same lithographic mask for patterning the first photoresist layer 17 and the second photoresist layer 37, the cost of patterning the contiguous dielectric material liner 56L can be reduced in comparison with the case in which two different lithographic masks are employed to pattern the photoresist layers (17, 37).

Horizontal portions of the contiguous dielectric material liner 56L within the opening in the second photoresist layer 37 can be removed by an anisotropic etch. The anisotropic etch can be selective to the semiconductor material of the semiconductor material portions 30. The anisotropic etch may, or may not, be selective to the dielectric material of the dielectric gate caps 58. If the anisotropic etch is not completely selective to the dielectric material of the dielectric gate caps 58, portions of the dielectric gate caps 58 within the area of the opening in the second photoresist layer 37 can be recessed relative to the top surfaces of the portions of the dielectric gate caps 58 that underlie the second photoresist layer 37.

For each gate structures (50, 52, 58) including a portion within the opening in the second photoresist layer 37, a sidewall of the patterned second photoresist layer 37 overlies the top surface of the gate structure (50, 52, 58). In one embodiment, the sidewall of the patterned second photoresist layer 37 can straddle the entire width of a gate structure (50, 52, 58). The physically exposed horizontal portions of the contiguous dielectric material liner 56L can be removed by an anisotropic etch that employs the patterned second photoresist layer 37 as an etch mask. Further, vertical portions of the contiguous dielectric material liner 56L can be vertically recessed at least by the height of the semiconductor material portions 30. Thus, the contiguous dielectric material liner 56L is etched, and underlying surfaces of the semiconductor material portions 30 are physically exposed, from the portions of the sidewalls of the semiconductor material portions 30 located within the opening in the second photoresist layer 37, not underlying the gate structures (50, 52, 58), and laterally spaced from the sidewalls of the gate structures (50, 52, 58) by a distance greater than the thickness of the contiguous dielectric material liner 56L. The second photoresist layer 37 can be subsequently removed, for example, by ashing.

Referring to FIGS. 6A-6C, remaining portions of the contiguous dielectric material liner 56L within the opening in the second photoresist layer 37 constitute dielectric spacers 56. Each dielectric spacer 56 is contiguously adjoined to the remaining portion of the contiguous dielectric material liner 56L that underlies the patterned second photoresist layer 37. In one embodiment, the remaining portion of the contiguous dielectric material liner 56L is present on the entirety of the pair of endwalls of each gate structure (50, 52, 58).

For each gate structure (50, 52, 58) straddled by a sidewall of the patterned second photoresist layer 37, a pair of dielectric spacers 56 are formed on the lengthwise sidewalls of the gate structure (50, 52, 58). The pair of gate spacers 56 has topmost edges that are located below the horizontal plane including the top surface of the gate structure (50, 52, 58). The topmost edges of the gate spacers 56 can be located above the horizontal plane including the topmost surfaces of the gate semiconductor portions 52. For each gate semiconductor portion 52 in a gate structure (50, 52, 58), a pair of dielectric spacers 56, the remaining portion of the contiguous dielectric material liner 56L, the dielectric gate cap 58 within the gate structure (50, 52, 58), and a dielectric material portion underlying the semiconductor material portion 52, i.e., the gate dielectric 50 or the buried insulator layer 20, collectively encapsulates the gate semiconductor portion 52. As used herein, a set of first elements encapsulate a second element if, and only if, the entire surface of the second element is contacted by surfaces of the set of first elements.

In one embodiment, the contiguous dielectric material liner 56L contacts the top surface of the substrate (10, 20) and the pair of endwalls of each gate structure (50, 52, 58). Each dielectric spacer 56 is contiguously adjoined to, and has the same composition as, the contiguous dielectric material liner 56L. The maximum thickness of each dielectric spacer 56 can be the same as the thickness of the contiguous dielectric material liner 56L. Each dielectric spacer 56 can have a tapered top end. Each dielectric spacer 56 can contact a lower portion of one of the pair of lengthwise sidewalls of a gate structure (50, 52, 58).

In one embodiment, the contiguous dielectric material liner 56L can contact peripheral portions of the pair of lengthwise sidewalls of a gate structure (50, 52, 58). In one embodiment, the contiguous dielectric material liner 56L has a uniform thickness throughout, and the dielectric spacers 56 have a maximum thickness that is the same as the uniform thickness.

In one embodiment, a pair of dielectric spacers 56 contacting lengthwise sidewalls of a gate structure (50, 52, 58) can be contiguously adjoined to, and have the same composition as, the contiguous dielectric material liner 56L. The pair of dielectric spacers 56 can have topmost edges that contact the pair of lengthwise sidewalls of the gate structure (50, 52, 58), and can be located at the same height.

In one embodiment, a sidewall of the second photoresist layer 37 can extend along the lengthwise direction of a gate electrode (50, 52, 58) within the area of the gate electrode (50, 52, 58) at the processing steps of FIGS. 5A-5C. Specifically, the entirety of a sidewall of the patterned second photoresist layer 37 can be located between a pair of vertical planes including the pair of lengthwise sidewalls of the gate structure (50,52, 58). In this case, a dielectric spacer 56 can be formed only on one lengthwise sidewall of the gate electrode (50, 52, 58), and the contiguous dielectric material liner 56L can contact the entirety of the other lengthwise sidewalls of the gate structure (50, 52, 58).

In one embodiment, the dielectric spacers 56 can be formed on the lengthwise sidewalls of two or more gate structures (50, 52, 58). In this case, each gate structure (50, 52, 58) can straddle the semiconductor material portions 30, and the contiguous dielectric material liner 56L can extend from a bottom edge of one gate structure (50, 52, 58) to a bottom edge of another gate structure (50, 52, 58). Each bottom edge of a gate structure (50, 52, 58) is directly adjoined to, and contacts, the top surface of the substrate (10, 20).

Referring to FIGS. 7A-7C, various source regions (not expressly shown) and/or drain regions (not expressly shown) can be formed within various regions of the semiconductor material portions 30 employing methods known in the art. Subsequently, a selective semiconductor deposition process can be performed. A selective semiconductor deposition process is a process in which a semiconductor material is deposited on semiconductor surfaces while deposition of the semiconductor material on dielectric surfaces is suppressed. The first exemplary semiconductor structure is loaded into a process chamber configured to perform a selective semiconductor deposition process. During the selective semiconductor deposition process, a semiconductor precursor gas and an etchant gas are concurrently, or alternately, flowed into the process chamber.

The semiconductor precursor gas can be any precursor gas that can deposit a semiconductor material as known in the art. The semiconductor precursor gas can be a single reactant gas or a combination of a plurality of reactant gases. For example, the semiconductor precursor gas can be $SiH_4$, $SiH_2Cl_2$, $SiHCl_3$, $SiCl_4$, $GeH_4$, $Ge_2H_6$, and/or other semiconductor precursor gases for Group IV semiconductor materials, Group III-V compound semiconductor materials, or Group II-VI compound semiconductor materials.

The etchant gas can be any known etchant gas for etching the semiconductor material deposited by the semiconductor precursor gas. For example, the etchant gas can be hydrogen chloride gas.

The selective semiconductor deposition process may deposit a single crystalline semiconductor material on a single crystalline semiconductor surface as in the case of a selective epitaxy process, or may deposit a polycrystalline or amorphous semiconductor material depending on the process conditions. In one embodiment, the semiconductor material portions 30 can include a single crystalline semiconductor material, and the selective semiconductor deposition process can be a selective epitaxy process as known in the art. The deposited semiconductor material can be a doped semiconductor material, or can be an intrinsic semiconductor material.

Raised semiconductor material portions 3R are formed by deposition of a semiconductor material during the selective semiconductor deposition process on physically exposed surfaces of the semiconductor material portions 30. The selective semiconductor deposition process is performed on the semiconductor material portions 30, while the remaining portion of the contiguous dielectric material liner 56L after the anisotropic etch that forms dielectric spacers 56 is present over the substrate (10, 20). Particularly, the remaining portion of the contiguous dielectric material liner 56L can be present on the entirety of each endwall of the gate structures (50, 52, 58) during the selective semiconductor deposition process.

Referring to FIGS. 8A-8C, a dielectric material is deposited on the gate structures (50, 52, 58) and the raised semiconductor material portions 3R, and is subsequently planarized to form a dielectric material layer, which is herein referred to as a planarization dielectric layer 60. The dielectric material of the planarization dielectric layer can be doped silicate glass, undoped silicate glass, organosilicate glass, or a combination thereof. The dielectric material can be planarized, for example, by chemical mechanical planarization (CMP). The dielectric gate caps 58 can be employed as a stopping layer during the planarization process. In one embodiment, the planarized top surfaces of the dielectric gate caps 58 and the top surface of the planarization dielectric layer 60 can be coplanar, i.e., located within the same horizontal plane. Optionally, the dielectric liner (not shown) including a dielectric material such as silicon nitride or dielectric metal oxide can be deposited prior to formation of the planarization dielectric layer 60.

In one embodiment, the planarization dielectric layer 60 can contact an upper portion of at least one lengthwise sidewall of gate structures (50, 52, 58). A planarized portion of the contiguous dielectric material liner 56L can contact the entirety of remaining portions of the endwalls of each gate structure (50, 52, 58). The planarization dielectric layer 60 can overlie, and laterally surround, the contiguous dielectric material liner 56L, the dielectric spacers 56, and an upper portion of the lengthwise sidewalls of the gate structure (50, 52, 58). In one embodiment, the contiguous dielectric material liner 56L can contact peripheral portions of the topmost surface of each gate structure (50, 52, 58).

If the gate structures (50, 52, 58) are disposable gate structures, the gate structures can be removed selective to the planarization dielectric layer 60, the contiguous dielectric material liner 56L, the dielectric spacers 56, and the semiconductor material portions 30 employing a combination of etch chemistries, which can include at least one isotropic etch chemistry and/or at least one anisotropic etch chemistry. A gate cavity can be formed in each volume from which a gate structure (50, 52 58) is removed.

Figure 9C:
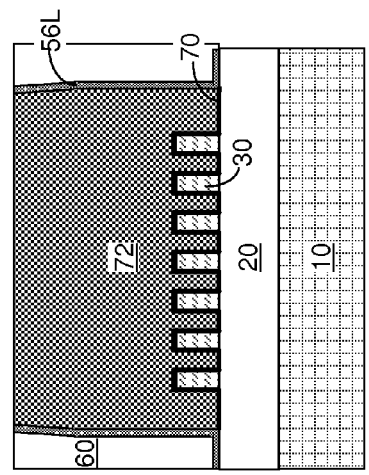
FIG. 9C is a vertical cross-sectional view of the first exemplary semiconductor structure along the vertical plane C-C' of FIG. 9A.
Figure 9A:
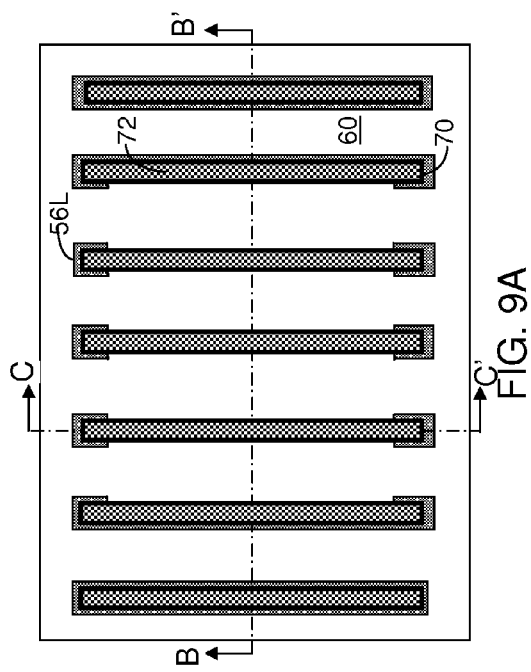
FIG. 9A is a top-down view of the first exemplary semiconductor structure after formation of replacement gate structures according to the first embodiment of the present disclosure.
Figure 9B:
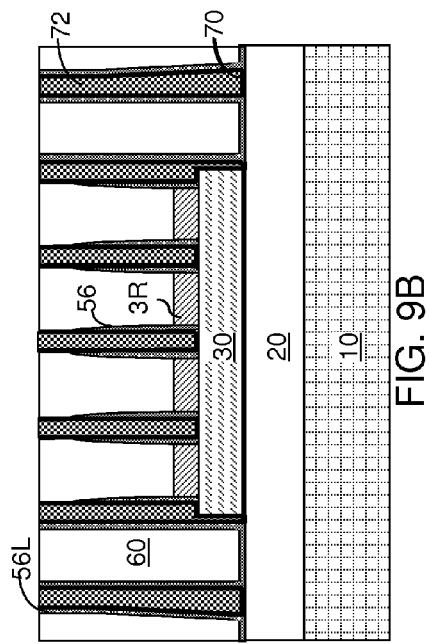
FIG. 9B is a vertical cross-sectional view of the first exemplary semiconductor structure along the vertical plane B-B' of FIG. 9A.

Referring to FIGS. 9A-9C, a replacement gate structure (70, 72) can be formed in each gate cavity. Each replacement gate structure (70, 72) can include a gate dielectric, which is herein referred to as a replacement gate dielectric 70, and a gate electrode, which is herein referred to as a replacement gate electrode 72. The replacement gate dielectric 70 can include a dielectric oxide and/or dielectric oxynitride of a semiconductor material, and/or a dielectric metal oxide. The replacement gate electrode 72 can include at least one doped semiconductor material and/or at least one metallic material.

The first exemplary semiconductor structure includes at least one semiconductor material portion 30 located on a substrate (10, 20), and a gate structure (70, 72) straddling the at least one semiconductor material portion 30. The gate structure (70, 72) includes a pair of lengthwise sidewalls adjoined to each other through a pair of endwalls. The first exemplary semiconductor structure further includes a contiguous dielectric material liner 56L contacting a top surface of the substrate and the pair of endwalls, and a dielectric spacer 56 contiguously adjoined to, and having the same composition as, the contiguous dielectric material liner 56L. The contiguous dielectric material liner 56L contacts a lower portion of one of the pair of lengthwise sidewalls. A topmost edge of the dielectric spacer 56 is located below a horizontal plane including a topmost surface of the gate structure (70, 72).

In one embodiment, the contiguous dielectric material liner 56L further contacts peripheral portions of the pair of lengthwise sidewalls of the gate structure (70, 72). In one embodiment, the contiguous dielectric material liner 56L has a uniform thickness throughout the entirety thereof, and the dielectric spacer 56 can have a maximum thickness that is the same as the uniform thickness. In one embodiment, a second dielectric spacer 56 having the same composition as the contiguous dielectric material liner 56L can be contiguously adjoined to the contiguous dielectric material liner 56L, and can have another topmost edge that contacts the gate structure (70, 72). In this case, the topmost edge of the second dielectric spacer 56 can contact a second lengthwise sidewall of the gate structure (70, 72), and can be located at the same height as the topmost edge of the dielectric spacer 56 located on the opposite side of the gate structure (70,72).

In case the gate structure (70, 72) overlies, and contacts, a set of endwalls of the semiconductor material portions 30, the contiguous dielectric material liner 56L can contact the entirety of a lengthwise sidewall of the gate structure (70, 72).

A dielectric material layer such as the planarization dielectric layer 60 can overlie, and laterally surround, the contiguous dielectric material liner 56L, the dielectric spacer 56, and an upper portion of the one of the pair of lengthwise sidewalls of the gate structure (70, 72).

A second gate structure (70, 72) straddling the at least one semiconductor material portion 30 can include another pair of lengthwise sidewalls adjoined to each other through another pair of endwalls. The contiguous dielectric material liner 56L can extend from a bottom edge of the gate structure (70, 72) to a bottom edge of the second gate structure (70, 72).

Referring to FIGS. 10A-10C, a contact level dielectric layer 80 can be formed over the planarization dielectric layer 60. The contact level dielectric layer 80 includes a dielectric material such as silicon oxide, silicon nitride, organosilicate glass, or a combination thereof. Various contact via structures (82, 84) can be formed through the contact level dielectric layer 80 and optionally through the planarization dielectric layer 60 to provide electrical contacts to various elements of underlying semiconductor devices, which can include at least one field effect transistor. The various contact via structures (82, 84) can include active region contact via structures 82 and gate contact via structures 84.

Optionally, the top portions of the replacement gate structures (70, 72) can be recessed to form recessed regions (not shown) overlying remaining portions of the replacement gate structures (70, 72). In this case, a dielectric material can be deposited into the recessed regions and planarized employing the top surface of the planarization dielectric layer 60 as a stopping layer. In this case, a dielectric gate cap (not shown) can be formed within each volume of a recessed region such that each replacement gate structure (70, 72) has an overlying dielectric gate cap.

Referring to FIGS. 11A-11C, a variation of the first exemplary semiconductor structure can be derived from the first exemplary semiconductor structure of FIGS. 7A-7C in case the gate structures (50, 52, 58) are permanent gate structures. In other words, the gate dielectrics 50 function as gate dielectrics of a field effect transistor, and the gate semiconductor portions 52 function as gate electrodes of a field effect transistor. A contact level dielectric layer 80 is formed over the semiconductor material portions 30, the raised semiconductor material portions 3R, the contiguous dielectric material liner 56L, the dielectric spacers 56, and the gate structures (50,52, 58). Optionally, the top surface of the contact level dielectric layer 80 can be planarized, for example, by chemical mechanical planarization, or by employing a self-planarizing deposition process such as spin-coating. In this case, the contact level dielectric layer 80 in FIGS. 11A-11C can provide the same function as the stack of the planarization dielectric layer 60 and the contact level dielectric layer 80 in FIGS. 10A-10C. Each gate structure (50, 52, 58) can provide the same function as a corresponding replacement gate structure (70, 72) in FIGS. 10A-10C. The contiguous dielectric material liner 56L can contacts peripheral portions of the topmost surface of each gate structure (50, 52, 58).

Referring to FIGS. 12A-12C, a second exemplary semiconductor structure according to a second embodiment of the present disclosure can be derived from the first exemplary semiconductor structure of FIGS. 4A-4C by performing an anisotropic etch on the contiguous dielectric material liner 56L selective to the semiconductor material portions 30. The same anisotropic etch can be employed as the anisotropic etch process employed at the processing steps of FIGS. 5A-5C. Dielectric spacers 56 can be formed as discrete structures on each gate structure (50, 52, 58), i.e., structures that do not contact one another. In one embodiment, the vertical profile of each dielectric gate cap 58 within a vertical plane extending along the lengthwise direction of the corresponding gate structure (50, 52, 58) can be trapezoidal. In this case, Recessing of the vertical portions of the contiguous dielectric material liner 56L on end walls of the gate structures (50, 52, 58) can be accelerated as the anisotropic etch progresses, and top portions of the end walls of each gate structure (50, 52, 58) can become physically exposed at the end of the anisotropic etch that forms the dielectric spacers 56.

Local pattern factor variation after removal of the horizontal portions of the contiguous dielectric material liner 56L affects the recess rate of the vertical portions of the contiguous dielectric material liner 56L during the vertical recessing of the contiguous dielectric liner 56L from sidewalls of the contiguous material portions 30. Particularly, the anisotropic etch can be a reactant-limited process, i.e., a process in which the etch rate is determined primarily by the amount of the etchant available to perform the reaction of the anisotropic etch chemistry. Within non-peripheral regions of the array R of the gate structures (50, 52, 58), the etchant for the anisotropic etch can be in short supply due to a high areal density of remaining vertical portions of the contiguous dielectric material liner 56L, while a sufficient amount of the etchant can be available for the anisotropic etch in peripheral regions of the array R and in regions outside of the array R. Thus, etch rate of the vertical portions of the contiguous dielectric material liner 56L can be higher at peripheral regions of the array R than at the non-peripheral region of the array R. In this case, topmost portions of a dielectric spacer 56 located on the endwalls of a gate structure (50, 52, 58) can be located below the interface between the gate semiconductor portion 52 and the gate cap dielectric 58 within the gate structure (50, 52, 58), and semiconductor surfaces of the gate semiconductor portion 52 can be physically exposed at each endwall of the gate structure (50, 52, 58). At the same time, the topmost portions of the dielectric spacer 56 located on the lengthwise sidewalls of the gate structure (50, 52, 58) can be located above the interface between the gate semiconductor portion 52 and the gate cap dielectric 58 within the gate structure (50, 52, 58). Semiconductor surfaces of the gate semiconductor portions 52 can be physically exposed on the endwalls of the gate electrodes (50, 52, 58).

As discussed above, an anisotropic etch can be employed to pattern the stack of gate level layers into the gate structures (50, 52, 58) during the processing steps of FIGS. 2A-2C. This anisotropic etch can also be a reactant-limited process. In this case, outermost gate electrodes (50, 52, 58) can develop at least one tapered sidewalls. Formation of dummy gate electrodes (50, 52, 58) that do not straddle any semiconductor material portions 30 outside of the array R does not eliminate this problem because the outermost gate electrodes (50, 52, 58) tend to develop the tapered sidewalls irrespective of whether the outermost gate electrodes (50, 52, 58) straddle the semiconductor material portions 30 or not. During the recessing of the vertical portions of the contiguous dielectric material liner 56L, the bottom portions of the contiguous dielectric material liner 56L on the tapered sidewalls of the outermost gate electrodes (50, 52, 58) can be removed, and the lower portions of the lengthwise sidewalls of the outermost gate structures (50, 52, 58) can be physically exposed.

Figure 13C:
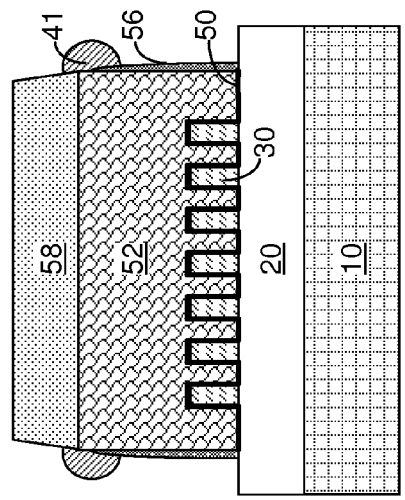
FIG. 13C is a vertical cross-sectional view of the second exemplary semiconductor structure along the vertical plane C-C' of FIG. 13A.
Figure 13A:
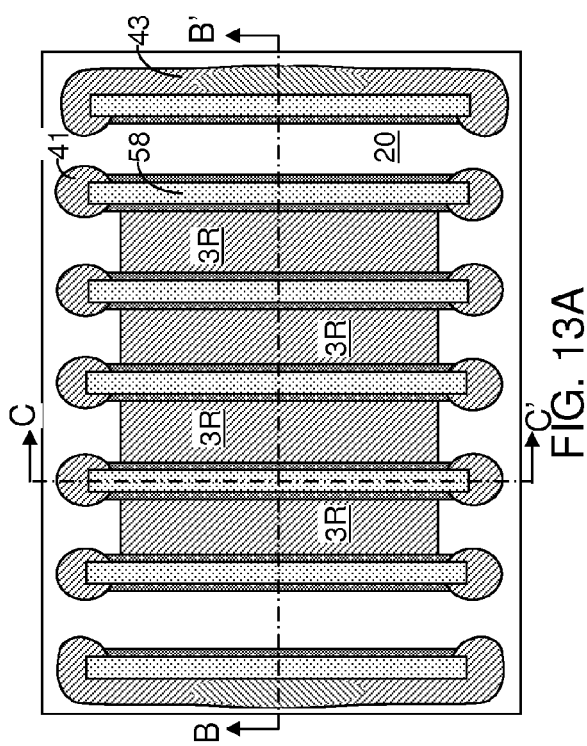
FIG. 13A is a top-down view of the second exemplary semiconductor structure after a selective semiconductor deposition process according to the second embodiment of the present disclosure.
Figure 13B:
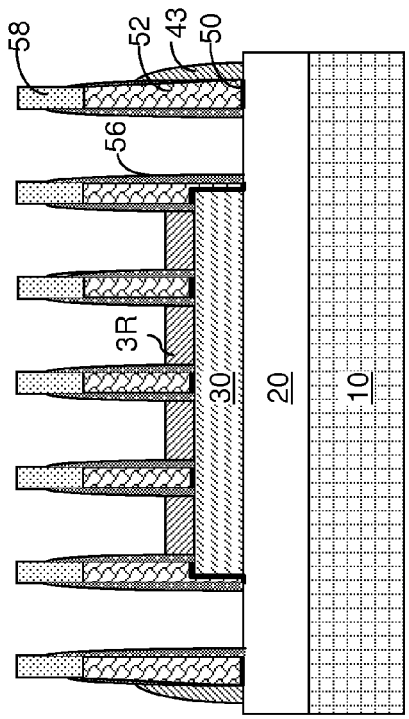
FIG. 13B is a vertical cross-sectional view of the second exemplary semiconductor structure along the vertical plane B-B' of FIG. 13A.

Referring to FIGS. 13A-13C, the processing steps of FIGS. 7A-7C can be performed. Specifically, various source regions (not expressly shown) and/or drain regions (not expressly shown) can be formed within various regions of the semiconductor material portions 30 employing methods known in the art. Subsequently, a selective semiconductor deposition process can be performed. The same process can be employed for the selective semiconductor deposition process in the second embodiment as in the first embodiment.

Raised semiconductor material portions 3R can be formed on the physically exposed surfaces of the semiconductor material portions 3R. In addition, semiconductor deposit portions (41, 43) can be formed concurrent with formation of the raised semiconductor material portions 3R on the physically exposed semiconductor surfaces of the gate semiconductor portions 52. The semiconductor deposit portions (41, 43) are undesirable collateral deposits of the same semiconductor material as the semiconductor material of the raised semiconductor material portions 3R. The semiconductor deposit portions (41, 43) are formed because the various portions of the semiconductor surfaces of the gate semiconductor portions 52 are physically exposed at the time of patterning the contiguous dielectric material liner 56L due to a taper in the outermost sidewalls of the gate structures (50, 52, 58) or due to the local variation in the density of available etchants during the anisotropic etch due to the inherent reduction in the areal density of vertical portions of the contiguous dielectric material liner 56L.

The semiconductor deposit portions (41, 43) include first semiconductor deposit portions 41 that are formed directly on portions of endwalls of the gate structures (50, 52, 58) that are surfaces of gate semiconductor portions 52 therein. The semiconductor deposit portions (41, 43) include second semiconductor deposit portions 43 that are formed directly on portions of lengthwise sidewalls of outermost gate structures (50, 52, 58) that are surfaces of the gate semiconductor portions 52 therein.

Figure 14A:
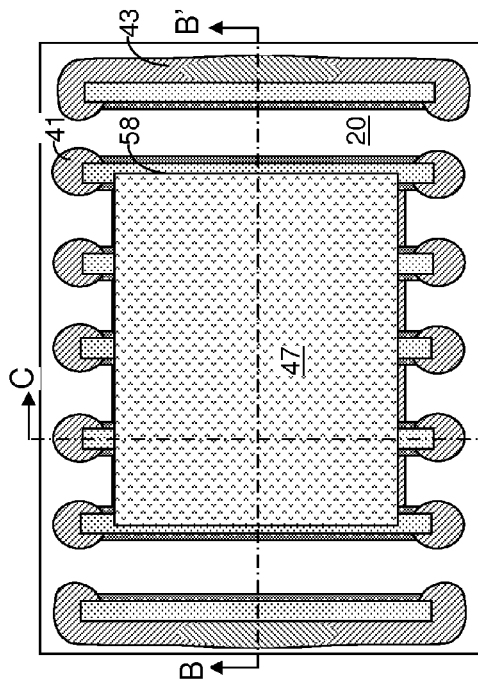
FIG. 14A is a top-down view of the second exemplary semiconductor after formation of a patterned photoresist layer according to the second embodiment of the present disclosure.
Figure 14C:
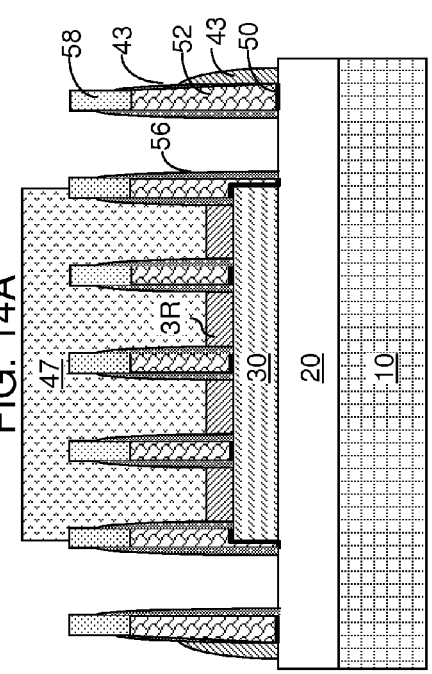
FIG. 14C is a vertical cross-sectional view of the second exemplary semiconductor structure along the vertical plane C-C' of FIG. 14A.
Figure 14B:
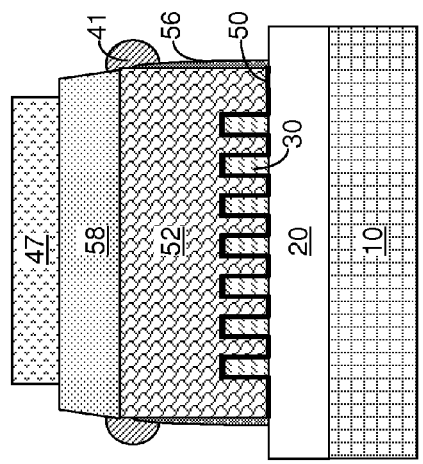
FIG. 14B is a vertical cross-sectional view of the second exemplary semiconductor structure along the vertical plane B-B' of FIG. 14A.

Referring to FIGS. 14A-14C, a patterned second photoresist layer 47 is formed over the gate structures (50, 52, 58) and the dielectric spacers 56. The patterned second photoresist layer 47 covers a region containing all of the raised semiconductor material portions 30, while all of the semiconductor deposit portions (41, 43) can be within the area not covered by the second photoresist layer 47.

To form the patterned second photoresist layer 47, a blanket photoresist layer is formed over the substrate (10, 20) and the gate structures (50, 52, 58), and is subsequently patterned by lithographic exposure and development. In one embodiment, the same lithographic mask can be employed to pattern the patterned second photoresist layer 47 as the first photoresist layer 17 (see FIGS. 2A-2C) with the same photoresist tones between the two lithographic processes. In one embodiment, the first photoresist layer 17 can include a positive tone photoresist material and the patterned second photoresist layer 47 can include another positive tone photoresist material. In another embodiment, the first photoresist layer 17 can include a negative tone photoresist material, and the patterned second photoresist layer 47 can include another negative tone photoresist material. In this case, the area covered by the patterned second photoresist layer 47 can be in substantially the same as the area covered by the patterned first photoresist layer 17. The lateral offset between corresponding sidewalls of the patterned second photoresist layer 47 and the patterned first photoresist layer 17 can be less than the sum of the overlay tolerance of the first lithographic process that defines the location of the sidewalls of the patterned first photoresist layer 17, the overlay tolerance of the second lithographic process that defines the location of the sidewalls of the patterned second photoresist layer 47, and the distance of photoresist edge shifting due to dose variations and/or changes in the photoresist material between the lithographic exposure processes for patterning the first and second photoresist layers (17, 47). By employing the same lithographic mask for patterning the first photoresist layer 17 and the second photoresist layer 47, the cost of pattering the two photoresist layers (17, 47) can be reduced in comparison with the case in which two different lithographic masks are employed to pattern the photoresist layers (17, 47).

The patterned second photoresist layer 47 does not overlie the endwalls of the gate structures (50, 52, 58) or the end portions of the gate structures (50, 52, 58). The patterned second photoresist layer 47 can overlies a portion lengthwise sidewalls of the gate structures (50, 52, 58). In one embodiment, the patterned second photoresist layer 47 does not overlie the outermost gate structures (50, 52, 58) located outside the array R (see FIG. 12A) of the gate structures (50, 52, 58).

Referring to FIGS. 15A-15C, an etch process can be performed to remove the semiconductor deposit portions (41, 43) selective to the dielectric spacers 56. In one embodiment, the etch process can be selective to the dielectric material of the gate cap dielectrics 58. The etch process is performed employing an etch chemistry that removes the semiconductor material of the semiconductor deposit portions (41, 43) while the patterned second photoresist layer 47 is present over the raised semiconductor material portions 3R. The etch process can employ an etchant that etches the semiconductor material of the semiconductor deposit portions (41, 43) such as hydrogen chloride gas. Specifically, the etch process can remove the first semiconductor deposit portions 41 from the endwalls of the gate structures (50, 52, 58), and the second semiconductor deposit portions 42 from the lengthwise sidewalls of the outermost gate structures (50, 52, 58). The patterned second photoresist layer 47 can be subsequently removed, for example, by ashing.

Figure 16C:
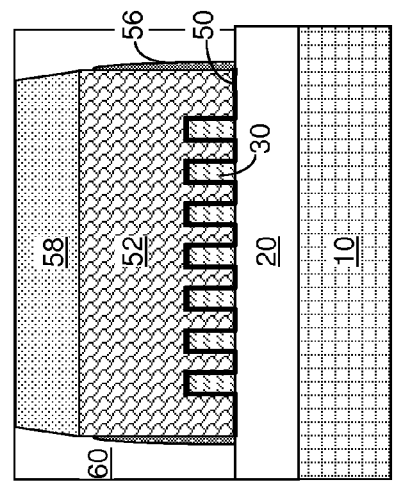
FIG. 16C is a vertical cross-sectional view of the second exemplary semiconductor structure along the vertical plane C-C' of FIG. 16A.
Figure 16A:
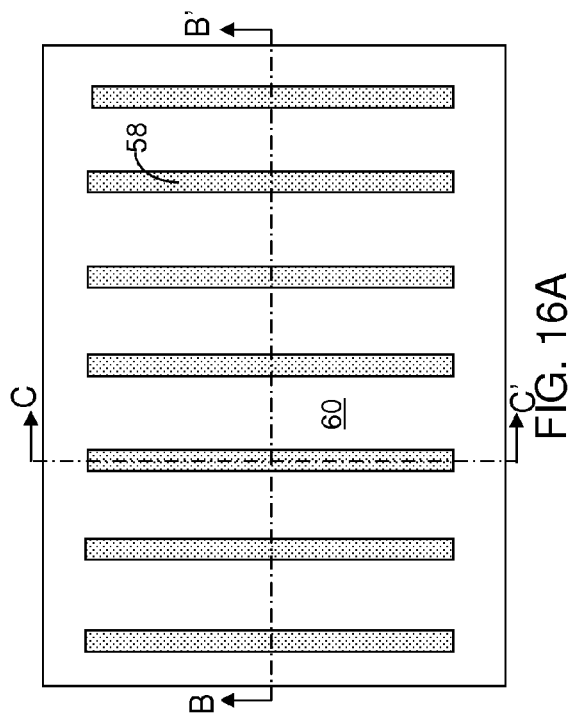
FIG. 16A is a top-down view of the second exemplary semiconductor after deposition and planarization of a planarization dielectric layer according to the second embodiment of the present disclosure.
Figure 16B:
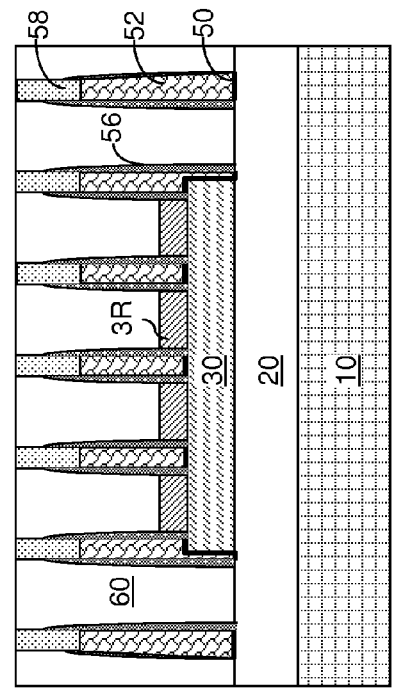
FIG. 16B is a vertical cross-sectional view of the second exemplary semiconductor structure along the vertical plane B-B' of FIG. 16A.

Referring to FIGS. 16A-16C, the processing steps of FIGS. 8A-8C can be performed to form a planarization dielectric layer 60 having a top surface that is coplanar with top surfaces of remaining portions of the gate structures (50, 52, 58) in the same manner as in the first embodiment.

Referring to FIGS. 17A-17C, the processing steps of FIGS. 9A-9C can be performed to form replacement gate structures (70, 72) in gate cavities formed by removal of the gate structures (50, 52, 58) in the same manner as in the first embodiment.

Referring to FIGS. 18A-18C, the processing steps of FIGS. 10A-10C can be performed to form contact level dielectric layer 80 and various contact via structures (82, 84) in the same manner as in the first embodiment.

Referring to FIGS. 19A-19C, a variation of the second exemplary semiconductor structure can be derived from the second exemplary semiconductor structure of FIGS. 15A-15C in case the gate structures (50, 52, 58) are permanent gate structures. The gate dielectrics 50 function as gate dielectrics of a field effect transistor, and the gate semiconductor portions 52 function as gate electrodes of a field effect transistor. A contact level dielectric layer 80 is formed over the semiconductor material portions 30, the raised semiconductor material portions 3R, the dielectric spacers 56, and the gate structures (50, 52, 58). Optionally, the top surface of the contact level dielectric layer 80 can be planarized. In this case, the contact level dielectric layer 80 in FIGS. 19A-19C can provide the same function as the stack of the planarization dielectric layer 60 and the contact level dielectric layer 80 in FIGS. 18A-18C. Each gate structure (50, 52, 58) can provide the same function as a corresponding replacement gate structure (70, 72) in FIGS. 18A-18C.

The patterned second photoresist layer 37 of the first embodiment is employed to limit the region in which dielectric spacers 56 are formed. The presence of the contiguous dielectric material liner 56L in the region covered by the patterned second photoresist layer 37 prevents etching of the contiguous dielectric material liner 56L in the covered region, and thus, prevents physical exposure of semiconductor surfaces of the gate semiconductor portions 52 within the gate structures (50, 52, 58). The patterning of the second photoresist layer 37 can be performed employing the same lithographic mask that is previously employed to pattern the semiconductor material portions 30 at the processing steps of FIGS. 2A-2C.

The patterned second photoresist layer 47 of the second embodiment is employed to protect raised semiconductor material portions 3R during an etch process, while physically exposing to the etch process the semiconductor deposit portions (41, 43), which are spurious semiconductor material portions that needs to be removed to prevent potentially deleterious effects. The patterning of the second photoresist layer 37 can be performed employing the same lithographic mask that is previously employed to pattern the semiconductor material portions 30 at the processing steps of FIGS. 2A-2C.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
   forming at least one semiconductor material portion on a substrate;
   forming a gate structure across said at least one semiconductor material portion, said gate structure including a pair of lengthwise sidewalls adjoined to each other through a pair of endwalls;
   forming a contiguous dielectric material liner on a top surface of said substrate, said pair of lengthwise sidewalls, said pair of endwalls, and a top surface of said gate structure;
   forming a patterned photoresist layer over said contiguous dielectric material layer, wherein a sidewall of said patterned photoresist layer overlies said top surface of said gate structure;
   forming at least one dielectric spacer by anisotropically etching portions of said contiguous dielectric material layer within an opening in said patterned photoresist layer, wherein each of said at least one dielectric spacer is contiguously adjoined to a remaining portion of said contiguous dielectric material liner that underlies said patterned photoresist layer, and wherein each dielectric spacer of said at least one dielectric spacer has a topmost surface that is located beneath a topmost surface of said gate structure, and each dielectric spacer of said at least one dielectric spacer directly contacts a lower portion of one of said pair of lengthwise sidewalls of said gate structure; and
   performing a selective semiconductor deposition process on said at least one semiconductor material portion while said remaining portion of said contiguous dielectric material layer is present over said substrate.

2. The method of claim 1, wherein said remaining portion of said contiguous dielectric material layer is present on an entirety of said pair of endwalls of said gate structure during said selective semiconductor deposition process.

3. The method of claim 1, wherein said sidewall of said patterned photoresist layer straddles an entire width of said gate structure, and said at least one dielectric spacer is a pair of dielectric spacers having topmost edges that are located below a horizontal plane including said top surface of said gate structure.

4. The method of claim 3, wherein said gate structure includes a vertical stack, from bottom to top, of a gate semiconductor portion and a dielectric cap, and said pair of dielectric spacers, said remaining portion of said contiguous dielectric material liner, said dielectric cap, and a dielectric material portion underlying said semiconductor material portion collectively encapsulates said gate semiconductor portion.

5. The method of claim 1, wherein an entirety of said sidewall of said patterned photoresist layer is located between a pair of vertical planes including said pair of lengthwise sidewalls of said gate structure.

6. The method of claim 1, further comprising forming and planarizing a dielectric material layer after said selective semiconductor deposition process, wherein said dielectric material layer contacts an upper portion of one of said pair of lengthwise sidewalls, and a planarized portion of said contiguous dielectric material liner contacts an entirety of remaining portions of said pair of endwalls of said gate structure.

7. The method of claim 1, wherein said topmost surface of said dielectric spacer of said at least one dielectric spacer is located beneath a topmost surface of a dielectric cap of said gate structure, and above a topmost surface of a gate semiconductor portion of said gate structure.

8. The method of claim 1, wherein each dielectric spacer of said at least one dielectric spacer is absent from an upper portion of said one of said pair of lengthwise sidewalls of said gate structure.

* * * * *